United States Patent
Cote et al.

(10) Patent No.: US 7,312,003 B2
(45) Date of Patent: Dec. 25, 2007

(54) DESIGN AND LAYOUT OF PHASE SHIFTING PHOTOLITHOGRAPHIC MASKS

(75) Inventors: Michel L. Cote, San Jose, CA (US); Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 526 days.

(21) Appl. No.: 10/799,073

(22) Filed: Mar. 12, 2004

(65) Prior Publication Data

US 2004/0175634 A1 Sep. 9, 2004

Related U.S. Application Data

(60) Division of application No. 10/085,759, filed on Feb. 28, 2002, now Pat. No. 6,787,271, which is a continuation-in-part of application No. 09/669,359, filed on Sep. 26, 2000, now Pat. No. 6,503,666.

(60) Provisional application No. 60/325,689, filed on Sep. 28, 2001, provisional application No. 60/304,142, filed on Jul. 10, 2001, provisional application No. 60/296,788, filed on Jun. 8, 2001, provisional application No. 60/215,938, filed on Jul. 5, 2000.

(51) Int. Cl.
*G03F 1/00* (2006.01)

(52) U.S. Cl. .......................................... 430/5

(58) Field of Classification Search .................... 430/5, 430/30, 311, 313, 322–324; 716/19, 20, 716/21

See application file for complete search history.

(56) References Cited

U.S. PATENT DOCUMENTS

| | | | |
|---|---|---|---|
| 5,811,211 A | 9/1998 | Tanaka et al. | |
| 5,923,562 A | 7/1999 | Liebmann et al. | |
| 6,040,892 A | 3/2000 | Pierrat | |

OTHER PUBLICATIONS

Jinbo et al. "0.2um Or Less i-Line Lithography By Phase-Shifting Mask Technology" IEEE, pp. 33.3.1-33.3.4 (1990).

Sakata, Miwa, et al., "A Novel Radiation Sensitive Spin-on-glass Convertible into SiO2 and the Simple Fabrication Processing Using It," 3 pages.

Pistor, Thomas V., "Rigorous 3D Simulation of Phase Defects in Alternating Phase-Shifting Masks," Proceedings of SPIE 4562-1038 (Mar. 2002), 13 pages.

(Continued)

*Primary Examiner*—S. Rosasco
(74) *Attorney, Agent, or Firm*—Kenta Suzue; Haynes Beffel & Wolfeld LLP

(57) ABSTRACT

A method for defining a full phase layout for defining a layer of material in an integrated circuit is described. The method can be used to define, arrange, and refine phase shifters to substantially define the layer using phase shifting. Through the process, computer readable definitions of an alternating aperture, dark field phase shift mask and of a complimentary mask are generated. Masks can be made from the definitions and then used to fabricate a layer of material in an integrated circuit. The separations between phase shifters, or cuts, are designed for easy mask manufacturability while also maximizing the amount of each feature defined by the phase shifting mask. Cost functions are used to describe the relative quality of phase assignments and to select higher quality phase assignments and reduce phase conflicts.

5 Claims, 24 Drawing Sheets

OTHER PUBLICATIONS

Ogawa, Kiyoshi, et al., "Phase Defect Inspection by Differential Interference," Proceedings of SPIE 4409-71, Apr. 26, 2001, 12 pages.

Rhyins, P., et al., "Characterization of Quartz Etched PSM Masks for KrF Lithography at the 100 nm node," Proceedings of SPIE 4562 (Mar. 2002), 486-495.

Sewell, Harry, et al., "An Evaluation of the Dual Exposure Technique,", 11 pages.

Wang, Ruoping, et al., "Polarized Phase Shift Mask: Concept, Design, and Potential Advantages to Photolithography Process and Physical Design," Proceedings of SPIE 4754-105, Apr. 25, 2002, 12 pages.

Matsuoka, et al., "Application of Alternating Phase-Shifting Mask to 0.16um CMOS Logic Gate Patterns," SPIE Proc. 3051, Mar. 10-14, 1997, 10 pages.

Semmier, Armin, et al., "Application of 3D EMF Simulation for Development and Optimization of Alternating Phase Shifting Masks," Proc. of SPIE 4346-37, Mar. 1, 2001, 12 pages.

Wong, Alfred K., "Polarization Effects in Mask Transmission," Proc. of SPIE 1674, Mar. 8, 1992, 8 pages.

Ackmann, Paul, et al., "Phase Shifting and Optical Proximity Corrections to improve CD control on Logic Devices in Manufacturing for sub 0.35 um I-Line," Proc. of SPIE 3051-07, Mar. 1997, 8 pages.

Spence, C., et al., "Detection of 60 degree Phase defects on Alternating PSMs," Proc. of SPIE 3412-73, Apr. 1998, 2 pages.

Sugawara, Minoru, et al., "Defect printability study of attenuated phase-shifting masks for specifying inspection sensitivity," Proc. SPIE 2621-49, Sep. 1995, 16 pages.

Schmidt, Regina, et al., "Impact of Coma on CD Control for Multiphase PSM Designs," Proc. SPIE 3334-02, Feb. 1998, 11 pages.

Erdmann, Andreas, "Topography effects and wave aberrations in advanced PSM-technology," Proc. SPIE 4346-36, Mar. 1, 2001, 28 pages.

Granik, Yuri et al., "CD variation analysis technique and its application to the study of PSM mask misalignment," Proc. SPIE 4186-94, Sep. 2000, 9 pages.

Ishiwata, Naoyuki, et al., "Fabrication of Phase-Shifting Mask," Proc. SPIE 1463, Mar. 1991, 11 pages.

Levenson, Marc D., et al., "Phase Phirst! An improved strong-PSM paradigm," Proc. SPIE 4186-42, Sep. 2000, 10 pages.

Levenson, Marc. D., et al., "SCAA mask exposures and Phase Phirst design for 110nm and below," Proc. SPIE 4346-817, Sep. 2001, 10 pages.

Morikawa, Yasutaka, et al., "100nm-Alt.PSM structure discussion for ArF lithography," Proc. SPIE 4409-22, Apr. 2001, 15 pages.

Ozaki, T., et al., "A 0.15um KrF Lithography for 1Gb DRAM Product using Highly Printable Patterns and Thin Resist Process," 1998 Symposium on VLSI Technology, Jun. 1998, Honolulu, Hawaii, 2 pages.

Ronse, Kurt, et al., "Comparison of various phase shift strategies and application to 0.35 um ASIC designs," Proc. SPIE 1927, 1993, 15 pages.

Rosenbluth, Alan E., et al., "Optimum Mask and Source Patterns to Print a Given Shape," Proc. SPIE 4346-49, Mar. 1, 2001, 17 pages.

Suzuki, Akiyoshi, et al., "Multilevel imaging system realizing k1-0.3 lithography," Proc. SPIE 3679-36, Mar. 1999, 13 pages.

Vandenberghe, G., et al., "(Sub-) 100nm gate patterning using 248nm alternating PSM," Mentor Graphics White Paper, May 2001, 9 pages.

Fritze, M., et al., "100-nm Node Lithography With KrF?" Feb. 1, 2001, 14 pages.

Fukuda, Hiroshi, et al., "Patterning of Random Interconnect Using Double Exposure of Strong-Type PSMs," Proc. SPIE 4346-695, Sep. 2001, 8 pages.

Ferguson, Richard A., et al., "Pattern-Dependent Correction of Mask Topography Effects for Alternating Phase-Shifting Masks," Proc. SPIE 2440-349, May 1995, 12 pages.

Toublan, Olivier, et al., "Phase and Transmission Errors Aware OPC Solution for PSM: Feasibility Demonstration," Proc. SPIE 4186-95, Sep. 13, 2000, 7 pages.

Yanagishita, Yuichiro, et al., "Phase-Shifting Photolithography Applicable to Real IC Patterns," Proc. SPIE 1463, Mar. 3, 1991, 11 pages.

Pierrat, C., "Investigation of Proximity Effects in Alternating Aperture Phase Shifting Masks," Sep. 2000, 11 pages.

Cote, Michel, et al., "A Practical Application of Full-Feature Alternating Phase-Shifting Technology for a Phase-Aware Standard-Cell Design Flow," Jun. 1, 2001, 6 pages.

Hanyu, Isamu, et al., "New phase-shifting mask with highly transparent SiO2 phase shifters," Proc. SPIE 1264-167, Jun. 1990, pp. 166-177.

McCallum, Martin, et al., "Alternating PSM Mask Performance—A Study of Multiple Fabrication Technique Results," Proc. SPIE 4346-723, Sep. 2001, 6 pages.

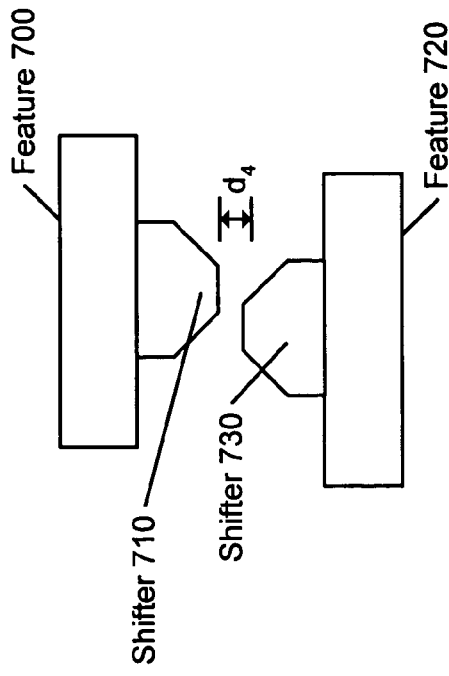
FIG. 7
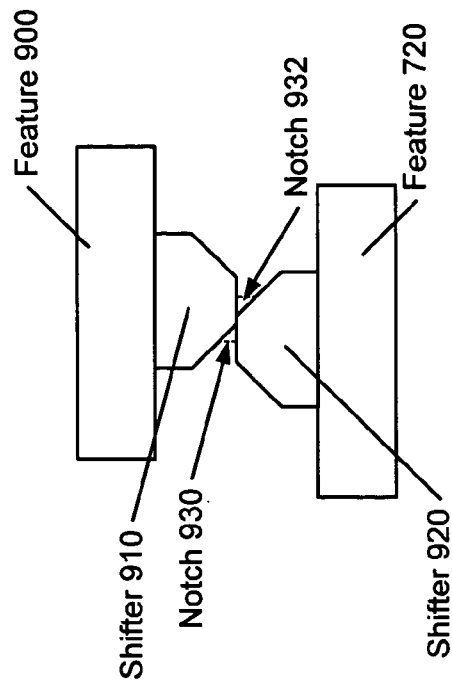
FIG. 9
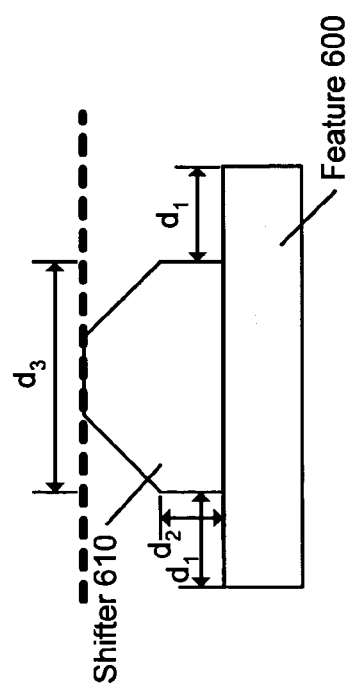
FIG. 6
FIG. 8

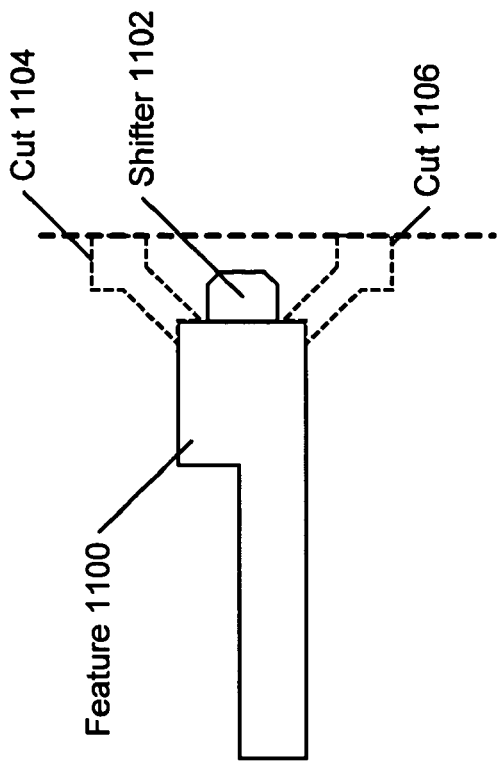
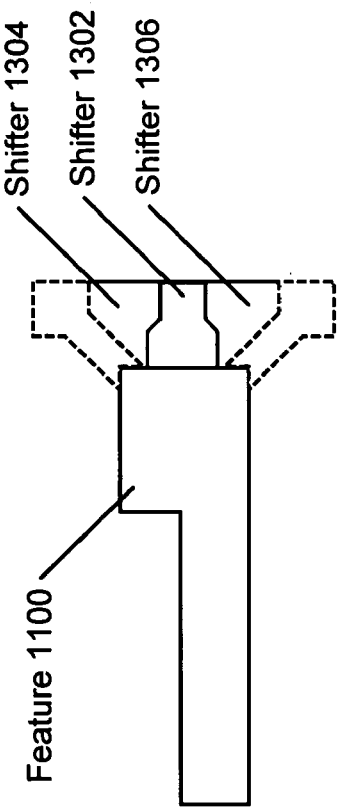
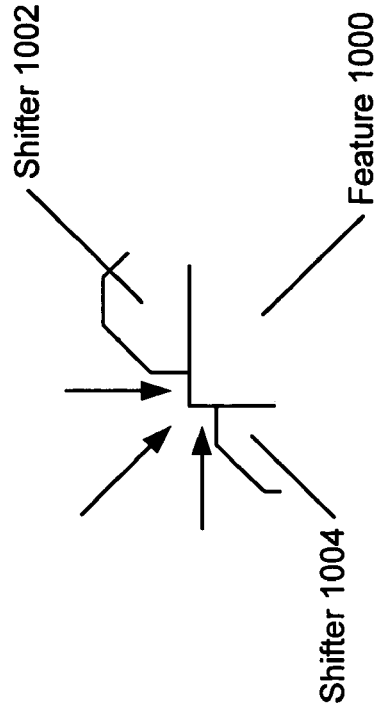
FIG. 10
FIG. 11
FIG. 12
FIG. 13

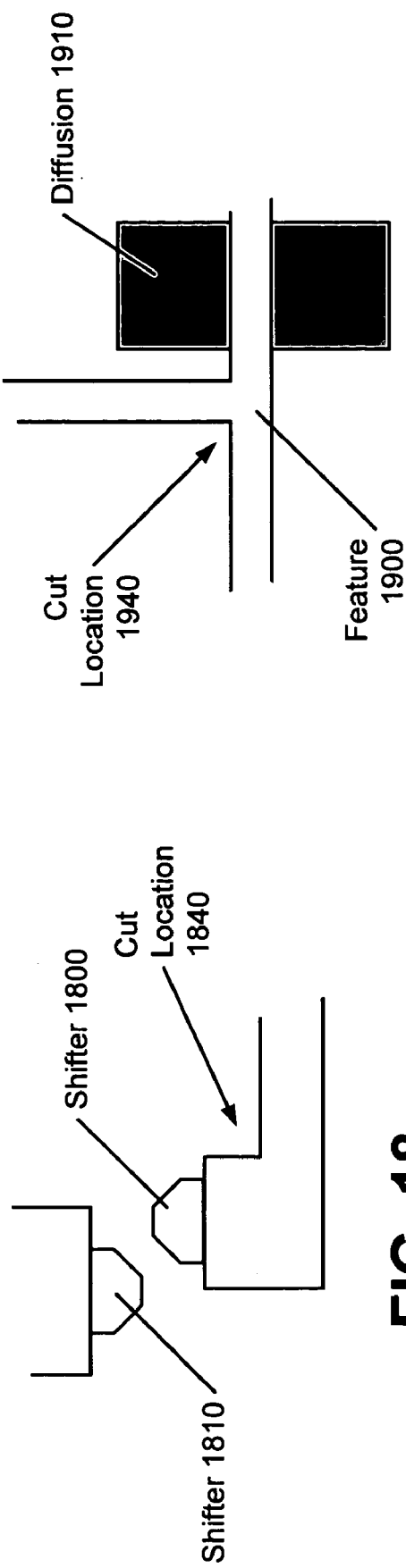
FIG. 18
FIG. 19
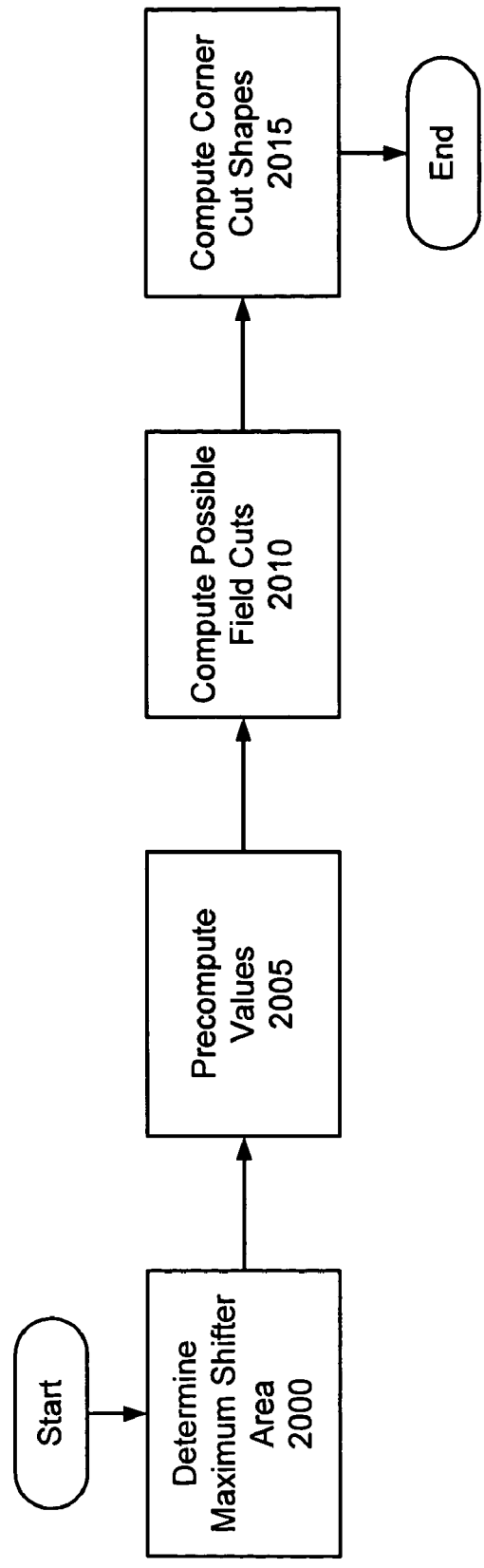
FIG. 20

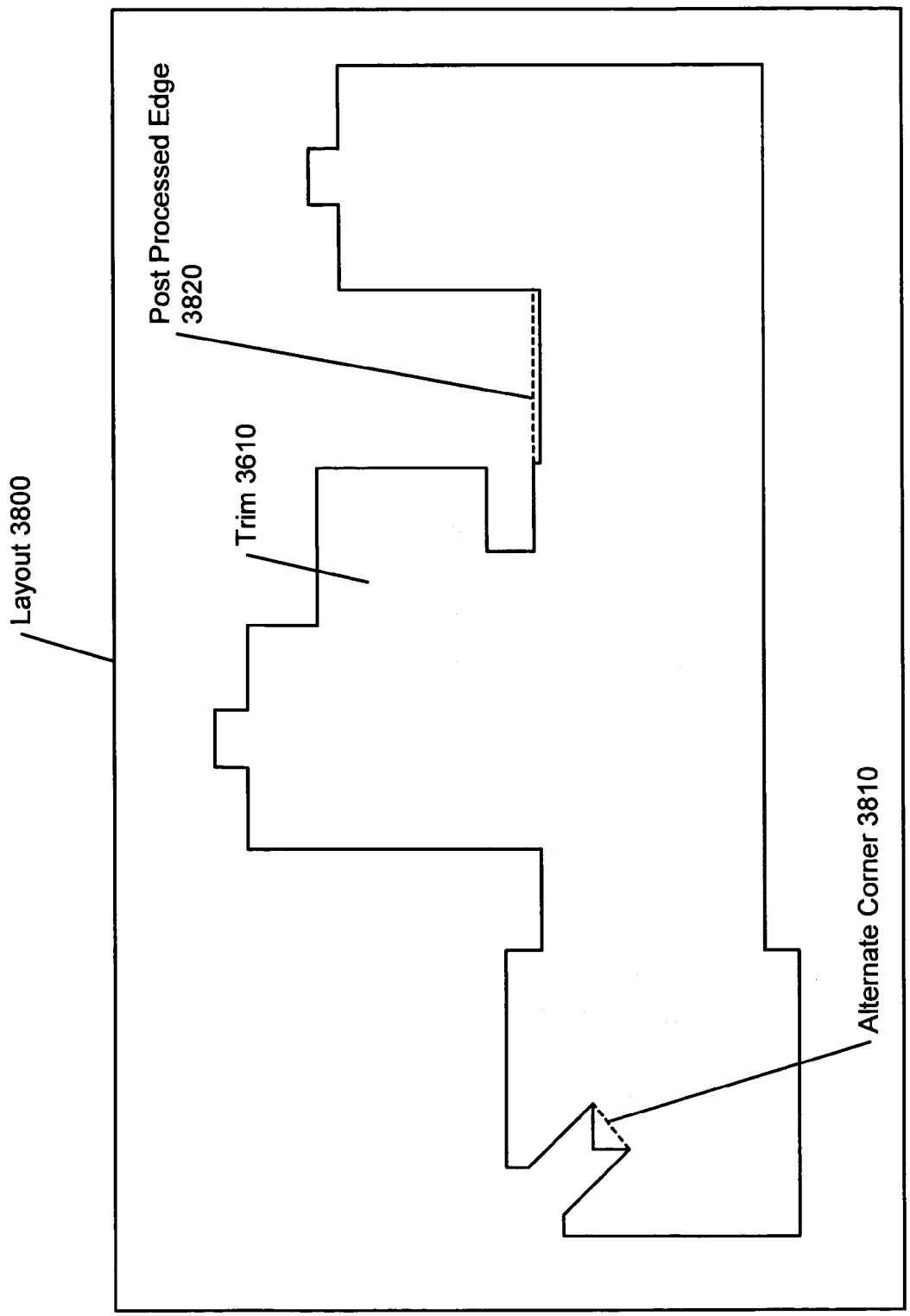

DESIGN AND LAYOUT OF PHASE SHIFTING PHOTOLITHOGRAPHIC MASKS

RELATED APPLICATIONS

This application is a divisional of U.S. application Ser. No. 10/085,759, filed 28 Feb. 2002 now U.S. Pat. No. 6,787,271, entitled "Design and Layout of Phase Shifting Photolithographic Masks," having inventors Christophe Pierrat and Michel Côté and assigned to the assignee of the present invention, which application is a continuation-in-part of, and incorporates by reference, U.S. patent application Ser. No. 09/669,359 filed 26 Sep. 2000 now U.S. Pat. No. 6,503,666 entitled "Phase Shift Masking for Complex Patterns" having inventor Christophe Pierrat and assigned to the assignee of the present invention, which is a non-provisional of U.S. Provisional Patent Application Serial No. 60/215,938 filed 5 Jul. 2000 entitled "Phase Shift Masking For Complex Layouts" having inventor Christophe Pierrat and assigned to the assignee of the present invention.

This application is a divisional of U.S. application Ser. No. 10/085,759, filed 28 Feb. 2002, entitled "Design and Layout of Phase Shifting Photolithographic Masks," having inventors Christophe Pierrat and Michel Côté and assigned to the assignee of the present invention, which application is related to, claims the benefit of priority of, and incorporates by reference, the U.S. Provisional Patent Application Serial No. 60/296,788 filed 8 Jun. 2001 entitled "Phase Conflict Resolution for Photolithographic Masks" having inventors Christophe Pierrat and Michel Côté and assigned to the assignee of the present invention.

This application is a divisional of U.S. application Ser. No. 10/085,759, filed 28 Feb. 2002, entitled "Design and Layout of Phase Shifting Photolithographic Masks," having inventors Christophe Pierrat and Michel Côté and assigned to the assignee of the present invention, which application is related to, claims the benefit of priority of, and incorporates by reference, the U.S. Provisional Patent Application Serial No. 60/304,142 filed 10 Jul. 2001 entitled "Phase Conflict Resolution for Photolithographic Masks" having inventors Christophe Pierrat and Michel Côté and assigned to the assignee of the present invention.

This application is a divisional of U.S. application Ser. No. 10/085,759, filed 28 Feb. 2002, entitled "Design and Layout of Phase Shifting Photolithographic Masks," having inventors Christophe Pierrat and Michel Côté and assigned to the assignee of the present invention, which application is related to, claims the benefit of priority of, and incorporates by reference, the U.S. Provisional Patent Application Serial No. 60/325,689 filed 28 Sep. 2001 entitled "Cost Functions And Gate CD Reduction In Phase Shifting Photolithographic Masks" having inventors Christophe Pierrat and Michel Côté and assigned to the assignee of the present invention.

BACKGROUND OF THE INVENTION

1. Field of the Invention

The present invention relates to manufacturing small dimension features of objects, such as integrated circuits, using photolithographic masks. More particularly, the present invention relates to phase shift masking of complex layouts for integrated circuits and similar objects.

2. Description of Related Art

Phase shift masking has been applied to create small dimension features in integrated circuits. Typically the features have been limited to selected elements of the design, which have a small, critical dimension. See, for example, U.S. Pat. No. 5,766,806.

Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift windows on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired feature. Thus, it is necessary to prevent inadvertent layout of phase shift windows in phase conflict near features to be formed in the layer defined by the mask.

In the design of a single integrated circuit, millions of features may be laid out. The burden on data processing resources for iterative operations over such large numbers of features can be huge, and in some cases makes the iterative operation impractical. The layout of phase shift windows and the assignment phase shift values to such windows, for circuits in which a significant amount of the layout is accomplished by phase shifting, is one such iterative operation which has been impractical using prior art techniques.

Because of these and other complexities, implementation of a phase shift masking technology for complex designs will require improvements in the approach to the design of phase shift masks.

SUMMARY OF THE INVENTION

A method for defining a full phase layout for defining a layer of material in an integrated circuit (IC) is described. In a full phase layout substantially all features of a layer of material, e.g. the polysilicon layer, are defined using phase shifting. By defining features using phase shifting, the majority of the layer can be composed of sub-wavelength features. For example if a $\lambda$=193 nm stepper is used then the a feature significantly less than $\lambda$ in size is difficult to manufacture on the final IC without using phase shifting. By providing a systematic approach to placing, shaping, and assigning phase to the phase shifters, the method can produce high quality layouts that can be produced as photolithographic masks. Those masks can in turn be used in the production of a layer of an IC.

For a given pattern, e.g. the polysilicon (or gate) layer of an integrated circuit, the features can be identified. By growing a region around the features—except for end caps of features—a maximum shifter area can be defined. The maximum shifter area corresponds to the space where the shifters are desirably placed to define the features. Shifter shapes can then be placed against the edges of the feature. The shifter shapes are spaced apart from one another to leave open spaces where cuts, or openings, between different shifters may be necessary. The spacing requirement is related to the design rules for minimum spacing and edge length and may be different for different types of situations, e.g. outer and inner corner.

In some embodiments, the shifter shapes are a trapezoid stacked on top of a rectangle. This shape is designed to admit a cut that has a square notch at the top. Thus avoiding pointed corners which may be difficult to manufacture in a mask.

In some embodiments, the shifter shapes are then refined to fill certain open areas within the maximum shifter area.

Next, phase dependencies between the different shifter shapes are determined along with costs. This is important because there are certain requirements for an alternating aperture phase shifting mask, e.g. shifter on opposite sides of a feature should have opposite phase. However, there may be additional considerations beyond phase conflicts that should be considered. For example, how desirable, or undesirable, is it to have two shifters be the same phase on an inside corner, outside corner, along three edges, etc. Other criterion may include multiple-layer dependencies, e.g. positioning based on contacts, diffusion areas, etc. As well as cost functions for small shifters. Overall, the cost functions describe the relative quality of a given arrangement, e.g. shifter shape A and shifter shape B given same phase.

Phase can then be assigned to the shifter shapes according to the dependencies and the cost functions. After that, same phase shifters can be merged together filling some of the previously open cut spaces. Additional refinements are provided by some embodiments of the invention including removal of small shifters, squaring of corners, and filling open spaces with the dominant or subordinate phase.

After the phase shifters are defined, the trim shapes can be defined using the phase shifter shapes and the original pattern. In some embodiments, the logical or of the finished phase shifter shapes and the original layout are combined, down-sized to account for mask misalignment errors and then another logical or is performed with the original layout. The trim layout may include attenuated phase shifting shapes, e.g. tri-tone mask, etc.

In some embodiments, the input is a file containing the layout in a format such as GDS-II stream format and the output may be one or more files. In one embodiment, the output is a single GDS-II stream format file containing both the trim and phase layers. In other embodiments, the output is two mask data files, one for each mask, suitable for use by mask fabrication machines.

Embodiments of the invention include photolithographic masks. The photolithographic masks include a phase mask and a complimentary mask. The phase mask comprises a dark field, alternating aperture phase mask where the phase windows have been arranged to define the target pattern as described above. The complimentary mask comprises a mask designed to clear artifact left by the phase mask and define and remaining edges or edge segments not defined by the phase mask.

Embodiments of the invention include methods for manufacturing integrated circuits. The method includes exposing a layer of material in an IC using masks prepared and defined as described above.

BRIEF DESCRIPTION OF THE FIGURES

FIG. 6 illustrates an initial shifter shape.

FIG. 7 illustrates the minimum shifter separation for merging.

FIG. 8 illustrates the shifters of FIG. 7 after merging.

FIG. 9 illustrates notches to be filled between proximate shifters.

FIG. 10 illustrates how the shifter shape of FIG. 6 leaves open cuts on outer corners.

FIG. 11 illustrates an initial shifter placement on a contact landing area.

FIG. 12 illustrates the layout of FIG. 11 after the shifter has been extended to the boundary.

FIG. 13 illustrates the layout of FIG. 12 after the open spaces are further filled by the shifter.

FIG. 18 illustrates the measurements used in a cost function for the small shifter area case.

FIG. 19 illustrates cost function sensitivity to features on other layers.

FIG. 20 is a process flow diagram for preparing a layout.

FIG. 38 illustrates the trim layer for use in conjunction with the layout of FIG. 35.

DETAILED DESCRIPTION

Overview

Methods and apparatuses for defining phase, and corresponding trim, layouts for defining a layer of material in an integrated circuit are described. Embodiments of the invention include mask data preparation (MDP) data created according to and by the methods and apparatuses described herein. Other embodiments include masks, or reticles, and integrated circuit products produced from the layouts defined by the methods and apparatuses described herein.

According to one embodiment of the invention an input layout, e.g. in GDS-II stream format, is received for a layer of material. Embodiments of the invention, e.g. by the process of FIG. 25 described below, produce one or more output layouts to define substantially all portions of the pattern of the layout using phase shifting. For example, the output layout may include a GDS-II stream file having one or more phase layers and a trim layer. In some embodiments, the 0 and 180 degree phase shifters are separated into different layers to assist in the mask manufacturing process. This is in part a limitation of the current GDS-II stream format, as the file format does not provide a standard way of designating phase on polygons within a layer. For convenience of illustration and discussion, the singular term phase layer as used herein will refer to all of the relevant phase layers in a given output file format designed for use in creating the phase mask. Thus the output is what is sometimes referred to as a "full phase" layout, or mask/reticle. Additionally, the output can include a corresponding layout for the complementary mask, sometimes referred to as a "trim mask", for use in conjunction with the full phase mask. As with the phase data, the trim data can be in the same file and/or a separate file.

The invention will be described in greater detail as follows. A variety of setup information including parameters, cutting shapes, shifter shapes, and the like will be considered first. Then the process used by some embodiments of the invention will be discussed with reference to an example layout.

Setup

The process whereby the phase layers and trim layers are defined is best understood with respect to the setup of the problem and several parameters used in working with the original layout. First, cut shapes and the arrangement of inner and outer corner cuts will be described. Then, the manner in which the boundary of the phase region is created will be considered. Next, the initial shifter shapes and sizes will be described. Then the process of gradually growing shifter shapes will be considered. Finally, cost functions used to determine placement and shaping of phase shifters and cuts will be considered.

Cut Shapes and Inner and Outer Corners

Figure 1:
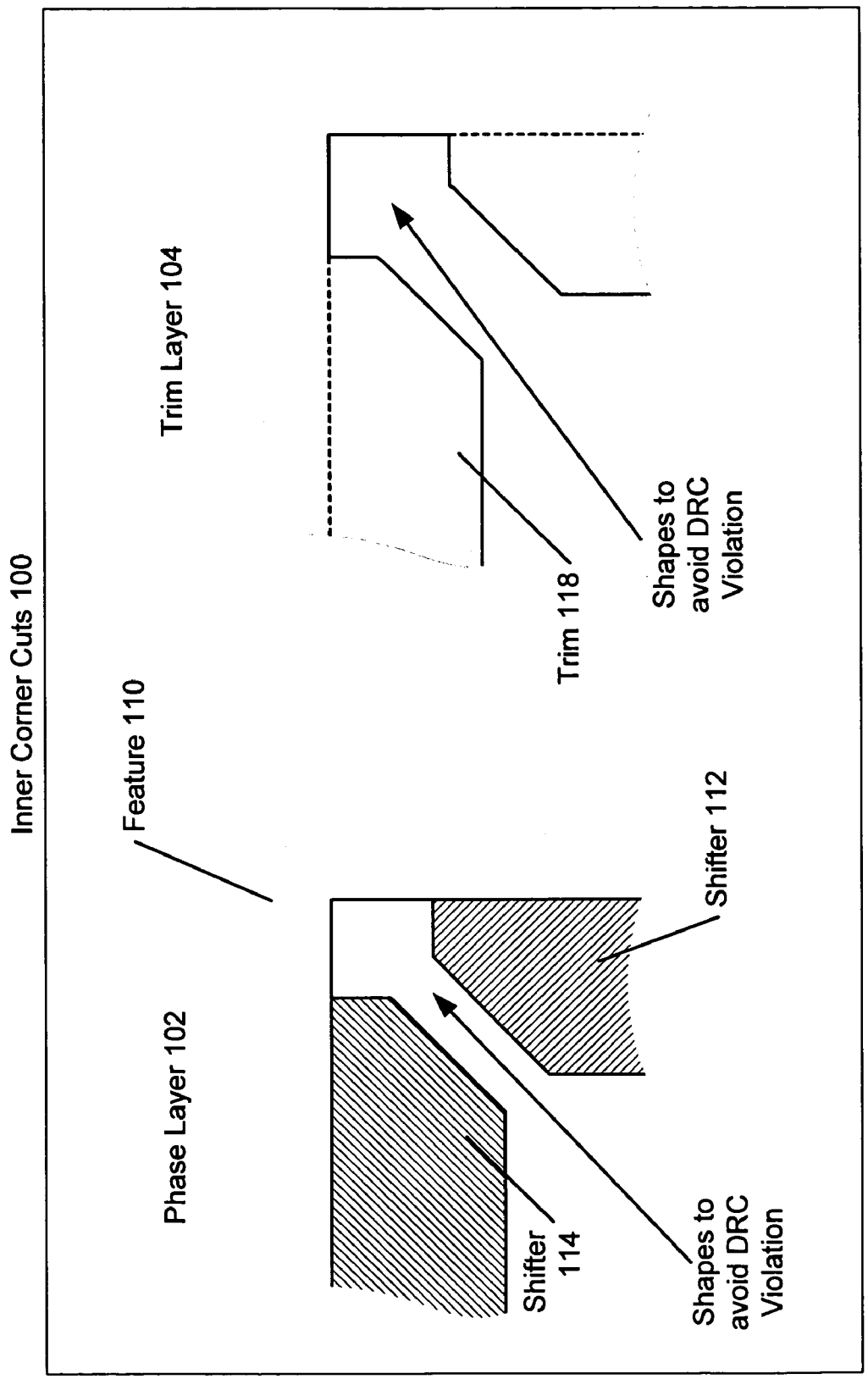
FIG. 1 illustrates exemplary inner corner cuts used to shape phase and trim layers.
Figure 2:
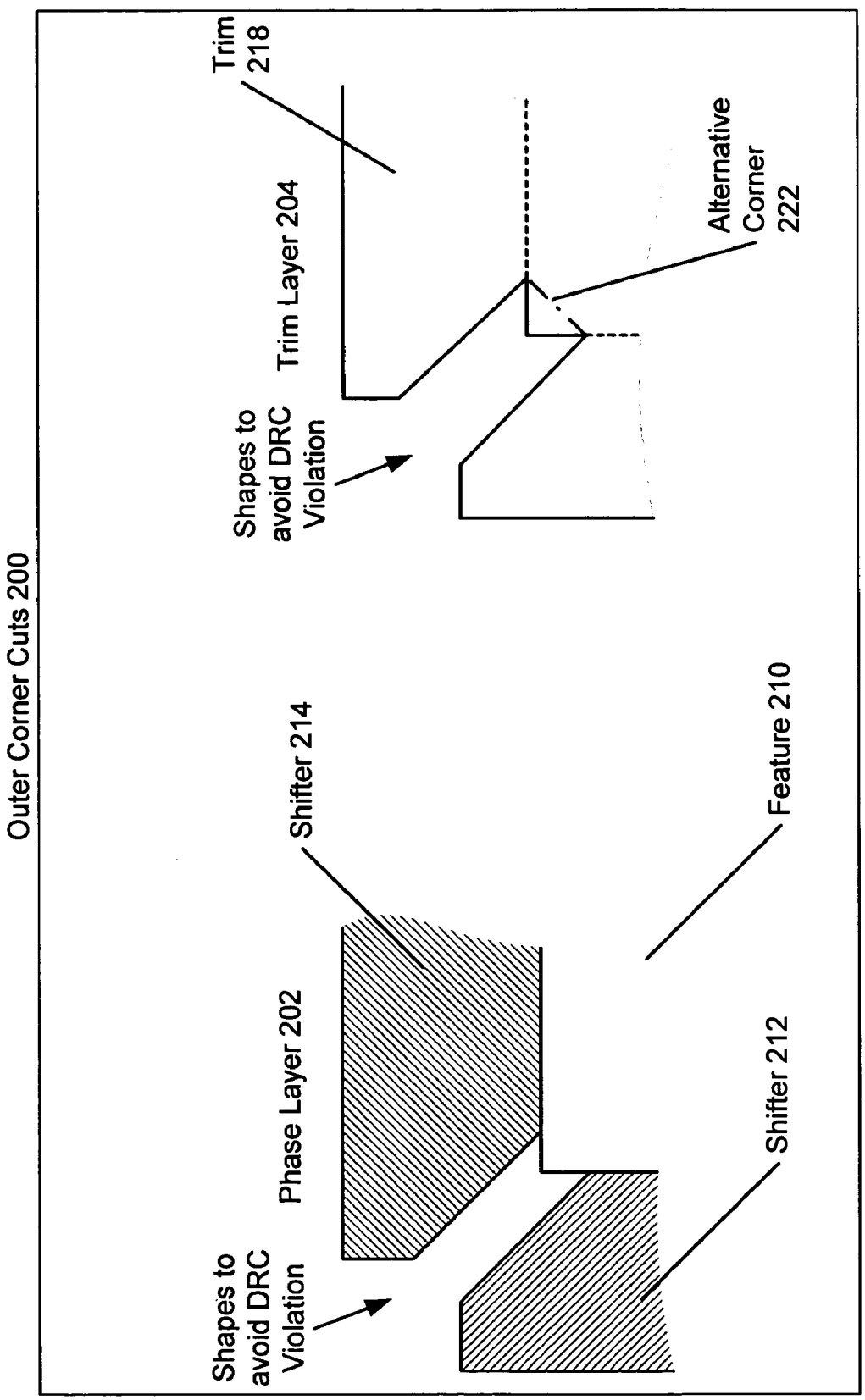
FIG. 2 illustrates exemplary outer corner cuts used to shape phase and trim layers.
Figure 3:
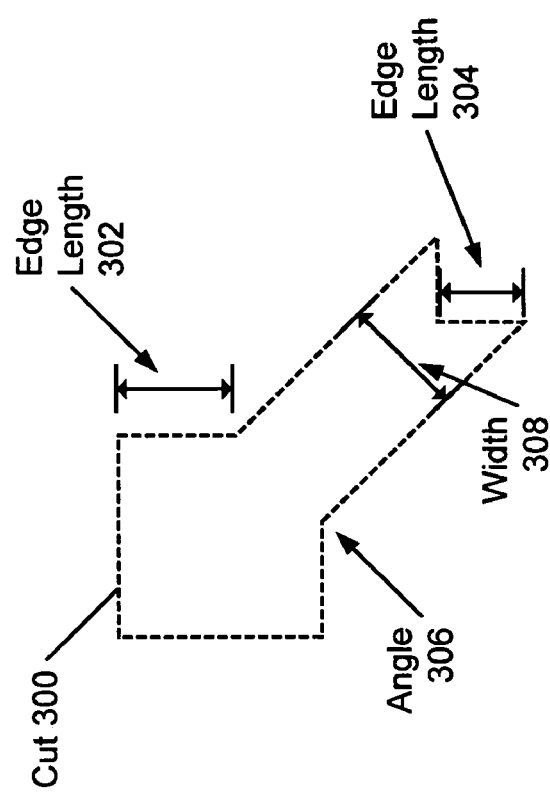
FIG. 3 illustrates the cut shape in greater detail.

Turning first to FIGS. 1-3, exemplary inner and out corner cuts for a layout are shown as well as a more detailed view of a cut shape used by one embodiment of the invention. Turning first to FIG. 1, inner corner cuts 100 are examined with respect to a phase layer 102 and a trim layer 104 for an exemplary inner corner. In the phase layer 102, a feature 110 is defined by a shifter 112 and a shifter 114 is shown (the feature 110 is actually not a part of the phase layer 102 itself). Similarly, the trim layer 104 includes a trim 118 to protect the areas defined by the shifters and define the corner. The boundary of the feature 110 is indicated by a dashed line in the trim layer 104. Of particular interest is the cut shape used, see discussion of FIG. 3, below for more detail. The cut shape comprises a substantially square shaped notch with a straight line neck at a 45 degree angle coming out of the corner of the notch. The shape is designed to comply with design rules-and more importantly-facilitate mask manufacturability.

Similarly, FIG. 2 shows outer corner cuts 200 including a phase layer 202 and a trim layer 204. In the phase layer 202, a feature 210 is defined by a shifter 212 and a shifter 214 (the feature 210 is not a part of the phase layer 202 itself but is shown for clarity of illustration). In the trim layer 204, a trim 218 to protect areas defined by the shifters and define the corner is shown. Dashed lines are used to show the boundary of the feature 210 in the trim layer 204. Additionally, a dotted and dashed line shows an alternative corner shape 222 that can be employed on the trim layer 204. The alternative corner is designed to be completely design rule clean. In comparison, the original corner might create a design rule violation due to the close proximity of the edges of the corner to the angled edges of the cut. As in FIG. 2, the similar cut shape is used to provide a design rule compliant—and more importantly—easy to manufacture mask for the layouts.

Turning to FIG. 3, an exemplary cut 300 is shown as a dotted outline. The cut 300 is shaped like the cuts used in FIG. 1 and FIG. 2 to separate shifter pairs. The shape includes a substantially square notch at the top that is intersected at an offset on a 45 degree angle by a straight neck that ends in a squared off form. Note that an angle 306 between the square notch and the neck. In one embodiment the angle is 135 degrees. The sizes of the various edges of the cut 300 will be process and design rule dependent. For example, the edge length 302 will be related to the minimum edge length for the process-accounting for mask manufacturing requirements. In one embodiment the edge length 302 is a multiple, r>0.0, of the minimum edge length. In this example, r=1.0. Similarly, the edge length 304 will be similarly dependent on the minimum edge length, e.g. a multiple r'>0.0 of the minimum edge length. In this example, r'=√2/2. The width 308 of the neck will be dependent on the minimum edge separation as well as the lithographic properties of the process, e.g. by a multiple r''>0.0. More specifically, the width 308 must be sufficient to allow the trim to clear phase artifacts left between the alternate phase shifters adjacent to the cut.

Boundaries

Figure 4:
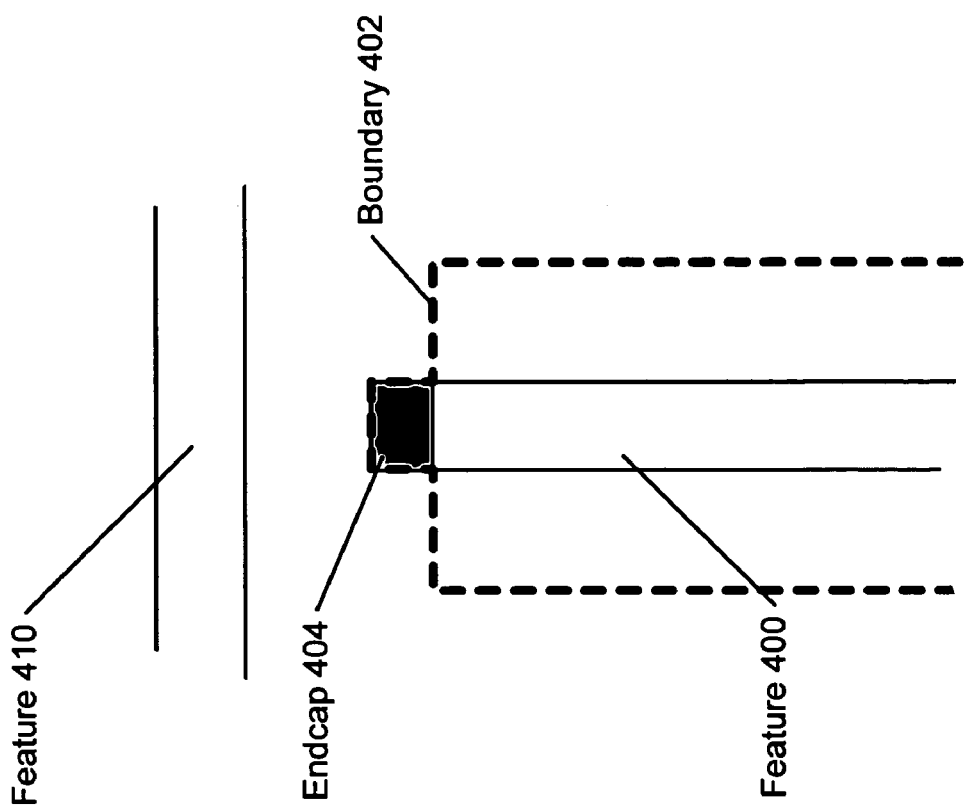
FIG. 4 illustrates a shifter boundary after endcap identification.

Continuing to FIG. 4 the desired phase boundary is shown for a feature 400 having an endcap 404. A boundary 402 is shown as a heavy dashed line. As seen, the boundary can be created by a grow operation on the feature shape-except where the endcap 404 is present. It should be noted that the height of the endcap 404 should be related to the minimum edge length, e.g. 0.8X, 1.0X, 1.1X, and more generally rX, r>=0.0. In some embodiments, the endcap area is a straight line resulting in a flat boundary across the top edge of the feature 400. This reflects a difference in whether or not the phase shifters or the trim will be used to define the end cap and how much the phase area on adjacent features will need to be reduced. More specifically, looking at a feature 410 adjacent to the endcap 404 of the feature 400, with the shifters for the feature 400 contained within the boundary 402, the need to reduce the boundary around the feature 410 will be less than if the shifters for the feature 400 extended all the way to the top of the endcap 404. Thus, the handling of endcaps represents a layout design tradeoff. In one embodiment, it is preferred to use the phase shifters to define the end cap and so the boundary is flat at the end caps.

In another embodiment, the endcap handling is determined on a case-by-case basis with reference to one or more rules describing how certain endcap cases should be handled. For example a rule might specify that if no feature is in close proximity to the endcap use a flat boundary. However, in situations where there is a close feature, e.g. as with the feature 410 in FIG. 4, then the area around the endcap should be defined using the trim layer. In still other embodiments, a simulation is performed on the area of the layout using both possibilities and the configuration resulting in better results is selected.

The boundary 402 should be set at the preferred shifter width for reproducing the feature 400. For example if the feature 400 has a critical dimension (CD) of X nm and the preferred shifter width is Y nm for a critical dimension of X nm with a given lithographic process (e.g. a specific wavelength of light, coherency, resist characteristics, etc.) then the boundary can be placed Y nm from the edges of the feature 400. For example, for a 248 nm wavelength lithographic process a preferred shifter width may be 150 nm-300 nm. The preferred width can be determined from test pattern simulations and measurements under a variety of conditions.

Figure 5:
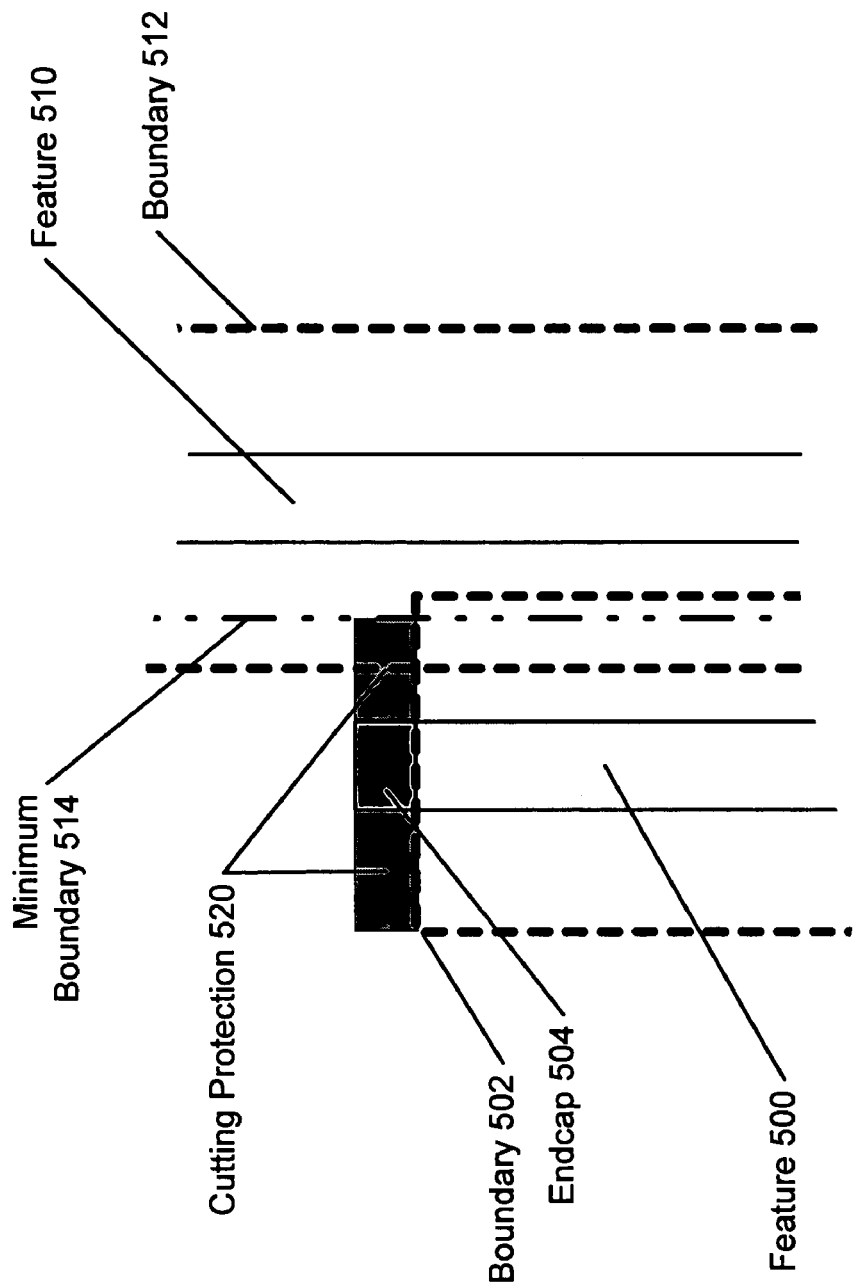
FIG. 5 illustrates an endcap cutting protection area.

Additional ways of handling the boundary vis-à-vis adjacent features and endcaps should be considered with reference to FIG. 5. Specifically, FIG. 5 shows a feature 500 and a feature 510 with boundary 502 and boundary 512, respectively. An endcap 504 on the feature 500 is shown. As can be seen the areas within the boundary 502 and the boundary 512 overlap. Also shown is a portion of the minimum boundary 514 associated with the feature 510 (heavy dotted and dashed line). The minimum boundary 514 represents a minimum shifter width for use in defining the feature 510. A cutting protection region 520 is shown (checkered pattern) on either side of the endcap 504. This region includes a minimum separation away from the top edge of the boundary 502 (e.g. the vertical direction in FIG. 5). It is also sufficiently wide in the other direction (e.g. horizontal direction in FIG. 5) to admit cuts, e.g. width of boundary 502. However, any area that must be included in accordance with the minimum boundary 514 is taken out of the cutting protection area as seen by the end of the cutting protection 520 at the minimum boundary 514 to ensure that there will be adequate shifter width to define the feature 510. Thus, the cutting protection 520 ensures that there is adequate room to admit a straight line cut to the right (or left) of the endcap 504 while also allowing the definition of the feature 510 using phase shifting.

Shifter Sizes and Shapes

Figure 22:
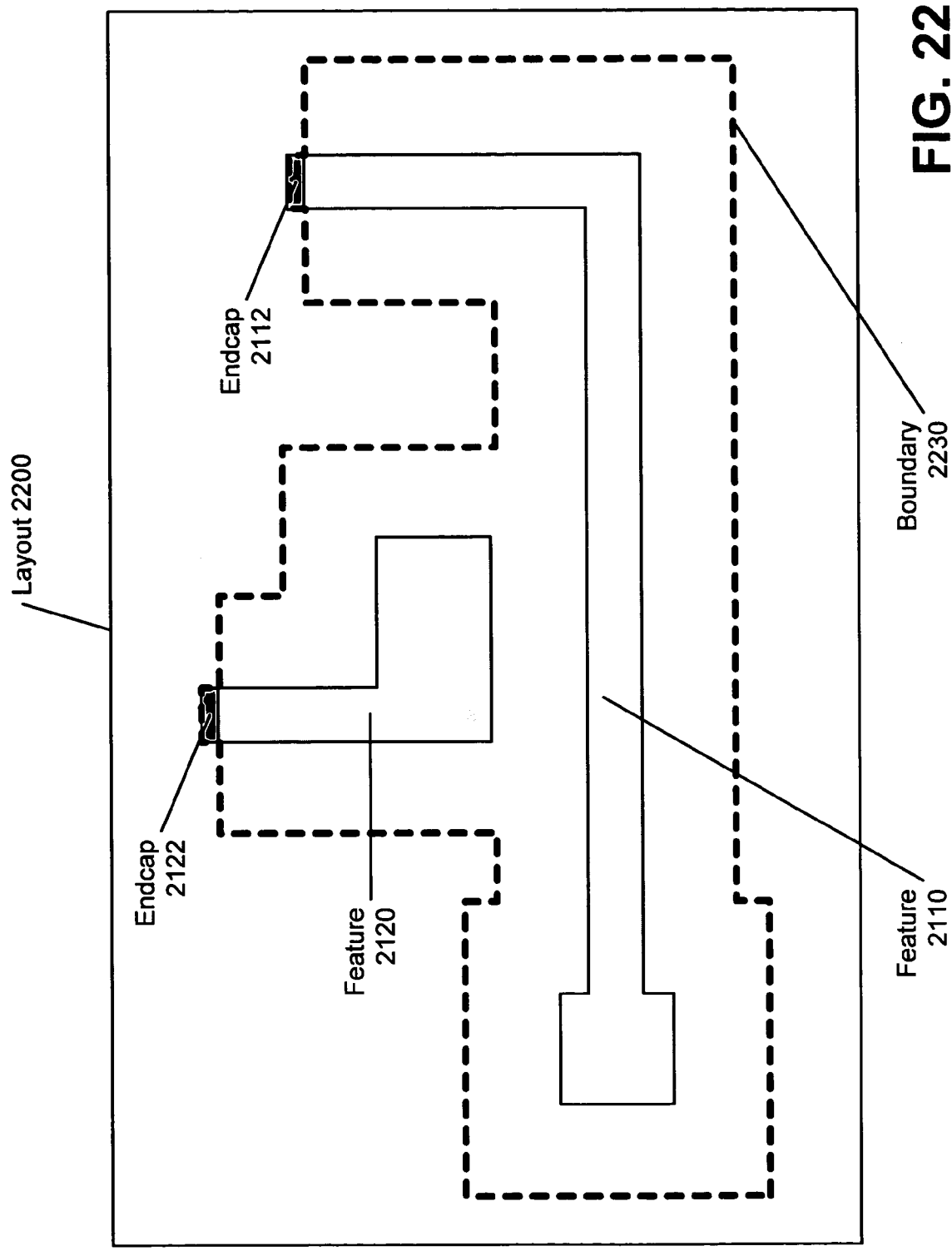
FIG. 22 illustrates the layout of FIG. 21 after shifter boundaries are defined.

Turning to FIG. 6, the basic shifter shape will be considered. Specifically, a feature 600 is shown with an associated shifter 610 placed adjacent to the feature. The shifter 610 has, at this point, not yet been assigned phase. At this point, shifter 610 is a rectangular shape with a trapezoid sitting on "top" of the rectangle. The edges of the trapezoidal portion are at 45 degrees to accommodate a cut. However, more generally any design rule compliant angle can be used. Another aspect of the shifter shape is it permits an adjacent cut to remain open even when the shifter directly abuts the base of the cut (see discussion of FIG. 22). The direction from the base of the shifter 610 abutting the feature 600 to the top of the shifter will be referred to as the (shifter) width as it is the relevant dimension for controlling the critical dimension (CD) of the feature 600. Additionally, for smaller shifters, the trapezoidal portion can be omitted provided the shifter meets the minimum width requirements.

The shifter 610 has been positioned along the edge that abuts the feature 600 so that a minimum distance $d_1$ has been maintained between the ends of the shifter and the next corner or, in this case, edge. The minimum distance $d_1$ should be of adequate size to admit a cut. In one embodiment, this distance is different for an inner versus an outer corner general form of Equation 1.

$$\text{Inner Corner } (1+\sqrt{2}/2)\text{dim} \quad (1)$$

$$\text{Outer Corner } (\sqrt{2}/2)\text{dim}$$

where dim is the minimum dimension permitted. More generally the form is a multiple r>0.0 of the minimum dimension.

Similarly, the shifter 610 is first placed with the rectangular portion at the minimum allowed shifter width, $d_2$. (This is the vertical direction in FIG. 6 along the axis from the base of the shifter towards the base of the trapezoidal region.) This minimum shifter width is derived from design rule parameters, e.g. minimum dimension. From a lithographic perspective, this may not be of a size sufficient to define the feature (e.g., the feature 600) in conjunction with the other shifters (not shown in FIG. 6) and the trim layer (also not shown). In one λ=248 nm process, $d_2$ is 0.06 μm.

Also, as seen in FIG. 6 it may be useful to maximize shifter length, $d_3$, as the starting length for the shifter 610, shown as the length along the top edge of the shifter 610 in FIG. 6. When the minimum width $d_2$ is used but $d_3$ is maximized, the trapezoidal portion of the shifter will generally predominate as seen in FIG. 6. Further, this shifter placement sets up the desired cutting positions. On an inner corner, only the single cut seen in FIG. 1 is available. On an outside corner, the shape of the shifter 610 allows the cut to come from any angle, including the forty-five degree angle shown in FIG. 2. More specifically, turning briefly to FIG. 10, where the outer corner of a feature 1000 is shown with shifter 1002 and shifter 1004 the arrows show that the outer corner cut can be placed at any angle based on the shifter positioning. Note also that the shifter 610 has been maximized in overall width to touch the boundary (heavy dashed lines). In some situations it may not be possible to expand the shifter to reach the boundary while maintaining a trapezoidal shape in which case the shifter shapes shown in FIGS. 11-13 can be used as appropriate.

Turning to FIG. 7, a feature 720 and a feature 700 that are part of a layout are now visible in the figure along with a shifter 730 and a shifter 710, respectively. The shifter 710 and the shifter 730 are in close proximity. Here, the separation between the respective shifters is less than the minimum separation, $d_4$. In some embodiments, $d_4$ corresponds to a minimum separation design rule and/or one or more lithographic parameters relating to minimum separation. In some embodiments of the invention, shifters are merged as shown in FIG. 8 with the shifter 710 and the shifter 730 merged into a shifter 810, shaped as shown. In some embodiments, notch filling may also need to be performed as described in conjunction with FIG. 9, e.g. to remain design rule compliant.

FIG. 9 illustrates a similar configuration to that found in FIG. 7 however here, the two original shifters, the shifter 920 and the shifter 910 adjacent to the feature 720 and the feature 900, respectively, are abutting one another leaving notches, the notch 930 and the notch 932. Some embodiments of the invention merge the shifters and fill such notches, as shown by the dashed lines. The width of the filled notch corresponds to the length over which the two shifters are less than, or equal to, $d_4$ apart in some embodiments.

Reshaping of Shifters

Turning to FIGS. 11-13, the reshaping of a shifter placed as described in FIG. 6 during the processing of the layout according to embodiments of the invention will be considered. FIG. 11 shows a feature 1100, a contact landing pad, and two of the cuts as dashed lines for the cut 1104 and the cut 1106. (The other cuts are omitted for clarity of illustration.) The outer edge of the cuts also show where the boundary, or preferred shifter width, would fall. (Emphasized by the heavy dashed line in FIG. 11 only.) As can be seen in FIG. 11 the shifter 1102 is placed at the minimum width, and length, with enough room to accommodate the cut 1104 and the cut 1106. However, if the sides of the trapezoids are maintained at a forty-five degree angle then the shifter cannot fill the entire shifter width to the boundary while maintaining the shapes shown in FIGS. 6-9.

During the processing of the layout, as will be described more fully in connection with FIG. 25, the shifter can be increased in size to the maximum width, as seen in FIG. 12. Here, the shifter 1202 is shown. In one embodiment, the reshaping of FIG. 12 is only performed if the boundary abuts the field of the layout. Further, as appropriate one or both of the surrounding areas between the shifter and the cuts can be incorporated into the shifter. The circumstances where this would be appropriate will be described in greater detail in conjunction with FIG. 25. FIG. 13 shows the expanded shifter as three separate shifters, the shifter 1302, the shifter 1304, and the shifter 1306. In the final output layout these will have the same phase and can, if appropriate, be merged into a single polygon representing the entire shifter. It should also be noted that the combined shape of the three shifters is similar to the shape of the shifter in FIG. 6 rotated so that the trapezoidal portion is adjacent to the original feature.

Cost Functions

Turning to FIGS. 14-17 cost functions used by embodiments of the invention will now be considered in greater detail. The cost functions can be used to describe the relative "badness" (or "goodness" depending on how the function is formulated) of accepting a particular configuration. For purposes of cost functions, a conflict is an arrangement of shifters on a phase layer of a layout that will cause a (desired) feature to either fully or partially fail to resolve. In addition to reducing conflicts, cost functions can be used to cause embodiments of the invention to prefer one configuration over another based on the relative cost of two choices. The use of the cost functions in designing the phase layer will be described in greater detail in connection with FIG. 25.

Figure 14:
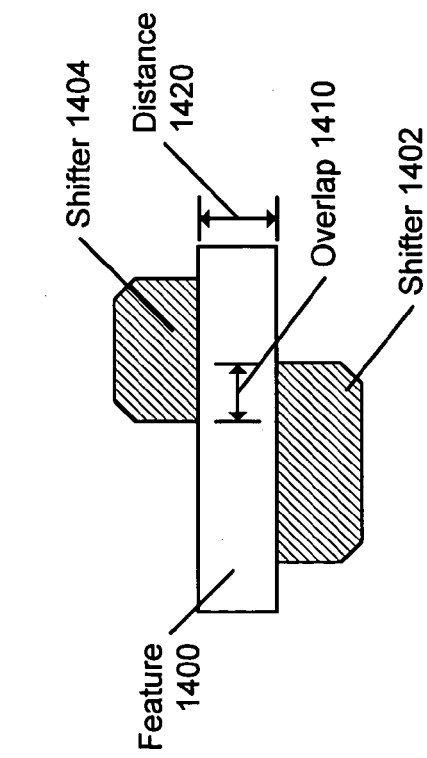
FIG. 14 illustrates the measurements used in a cost function for a straight line phase conflict.

FIG. 14 illustrates a conflict caused by overlapping same phase shifters. Specifically, in FIG. 14 a feature 1400 is surrounded in part by a shifter 1402 and a shifter 1404, both the same phase. The two shifters are separated by distance 1420, e.g. the width of the feature 1400. The region the two shifters overlap in is the overlap 1410. One way to express the cost of allowing this phase conflict is a formula of the general form of Equation 2.

$$r \frac{\text{overlap}}{(\text{distance} - \text{dim}) + \varepsilon} \quad (2)$$

Where overlap is the measurement of the phase conflict length (e.g. overlap 1410), distance is how far apart the shifters are (e.g. distance 1420), dim is the minimum feature width for the design, $\varepsilon$ is the minimum grid size, and $r>0.0$ is an implementation dependent ratio, according to one embodiment $r=1.0$ for a straight line shifter conflict. Thus, if the shifter 1402 and the shifter 1404 are the same phase and the length over which they overlap is large, the cost of permitting the conflict to remain in the layout is high.

Figure 15:
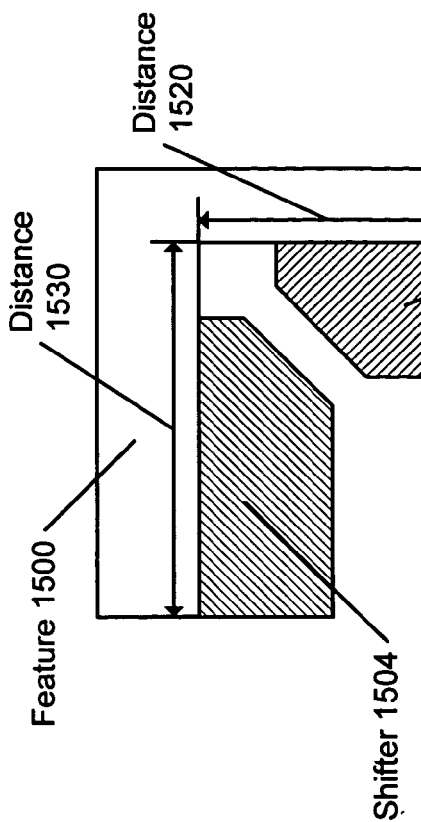
FIG. 15 illustrates the measurements used in a cost function for an inner corner.
Figure 16:
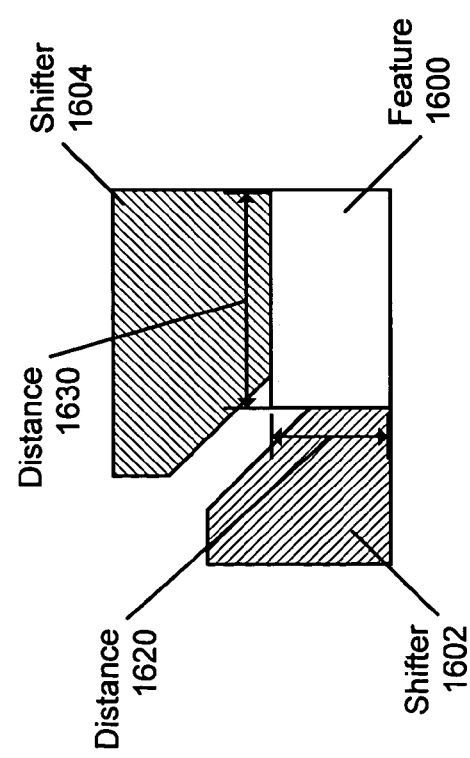
FIG. 16 illustrates the measurements used in a cost function for an outer corner.

The two-edge case has two basic forms: inner corner, FIG. 15, and outer corner, FIG. 16, and refers to an inner or outer corner. In the two-edge case some embodiments of the invention prefer to avoid cutting the phase region. Thus, in such embodiments, the cost function is designed to associate a greater cost with dividing the shifter 1502 and the shifter 1504 (that partially define the feature 1500) as opposed to having a single large (same-phase) shifter. The same goal is true with respect to FIG. 16 and the shifter 1602 and the shifter 1604 (that partially define the feature 1600).

More specifically, equations of the general form of Equation 3 can be used:

$$r \frac{1}{\min(d_{01}, d_{12})} \quad (3)$$

For either inner or outer corner computations where $d_{01}$ is the length of one of the two edges and $d_{12}$ is the length of the other and $r>0.0$. Returning to FIG. 15, the distance 1520 and the distance 1530 would correspond to $d_{01}$ and $d_{12}$, respectively. Similarly, in FIG. 16, the distance 1620 and the distance 1630 would correspond to $d_{01}$ and $d_{12}$, respectively. The ratio r used is implementation dependent. According to one embodiment, $r=16.0$ for outer corners and 6.0 for inner corners.

Figure 17:
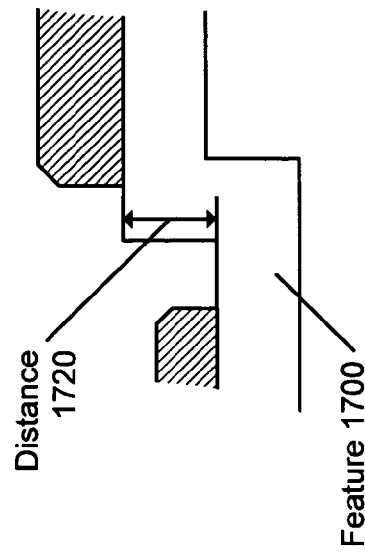
FIG. 17 illustrates the measurements used in a cost function for a three-edge case.

The three-edge case is illustrated by FIG. 17 and occurs when there are an inner and an outer corner in close proximity to one another, e.g. a "staircase" step. The feature 1700 has an edge with a distance 1720 that is insufficient to admit placement of a shifter shape according to the parameters described above in connection with FIG. 6. The preference is to assign all three edges the same phase, e.g. have a single contiguous shifter. Cost equations of the general form of Equation 4 can be used:

$$r \frac{1}{d_{12}} \quad (4)$$

where $r>0.0$ and $d_{12}$ corresponds to the length of the short edge, e.g. the distance 1720 in FIG. 17. The ratio r used is implementation dependent. According to one embodiment, $r=5.0$.

Additionally, some embodiments of the invention proscribe a cost function for small shifter areas. Take for example the situation of FIG. 18 where two small shifters, e.g. the shifter 1800 and the shifter 1810, are in close proximity. Such small shifters may be difficult to manufacture in the mask and it may be desirable to encourage them to be joined into a single, larger shifter. Such a cost function can be of the general form of Equation 5:

$$r\left(\frac{1}{a1} + \frac{1}{a2}\right) \quad (5)$$

where "a1" is the geometrical area of a first shifter within a given distance, e.g. n nanometers, of the current shifter and "a2" is the area of the current (small) shifter. For example, if the shifter 1800 is the current shifter, its area would be given by a2 while the area of the shifter 1810 would be given by a1. In one embodiment, r=0.07. As noted, the cost for all shifters within a given distance can be computed and/or the value of r can also be varied over distance, e.g. further away shifters use a lower r value.

Further, although the cost functions are shown as relating to a single ratio, r, in fact multiple ratios can be used. For example, in one embodiment, the value of r can be selected based on the other elements of the equation, e.g. if distance>120 nm, r=8.0 for an outer corner, but if distance>240 nm, r=4.0, etc. This can be used if no particular distance/area cutoffs are used when computing costs and/or to further modulate the relative costs based on the declining penalty for conflicts at greater distances. In other embodiments, the size of adjacent feature regions is relevant to the value of r. For example, if a cut will touch a relatively large region, e.g. a contact landing pad, it may be more desirable to allow a cut in that location than if the cut touches a smaller region, e.g. the T intersection. For example, consider the cut location 1840 in FIG. 18 adjacent to a large polysilicon region versus the cut location 1940 adjacent to a smaller polysilicon region. Thus in some embodiments, the value of r for large regions may be less than the value of r used for smaller adjacent regions because a phase conflict can be more easily corrected with OPC in larger regions.

Figure 21:
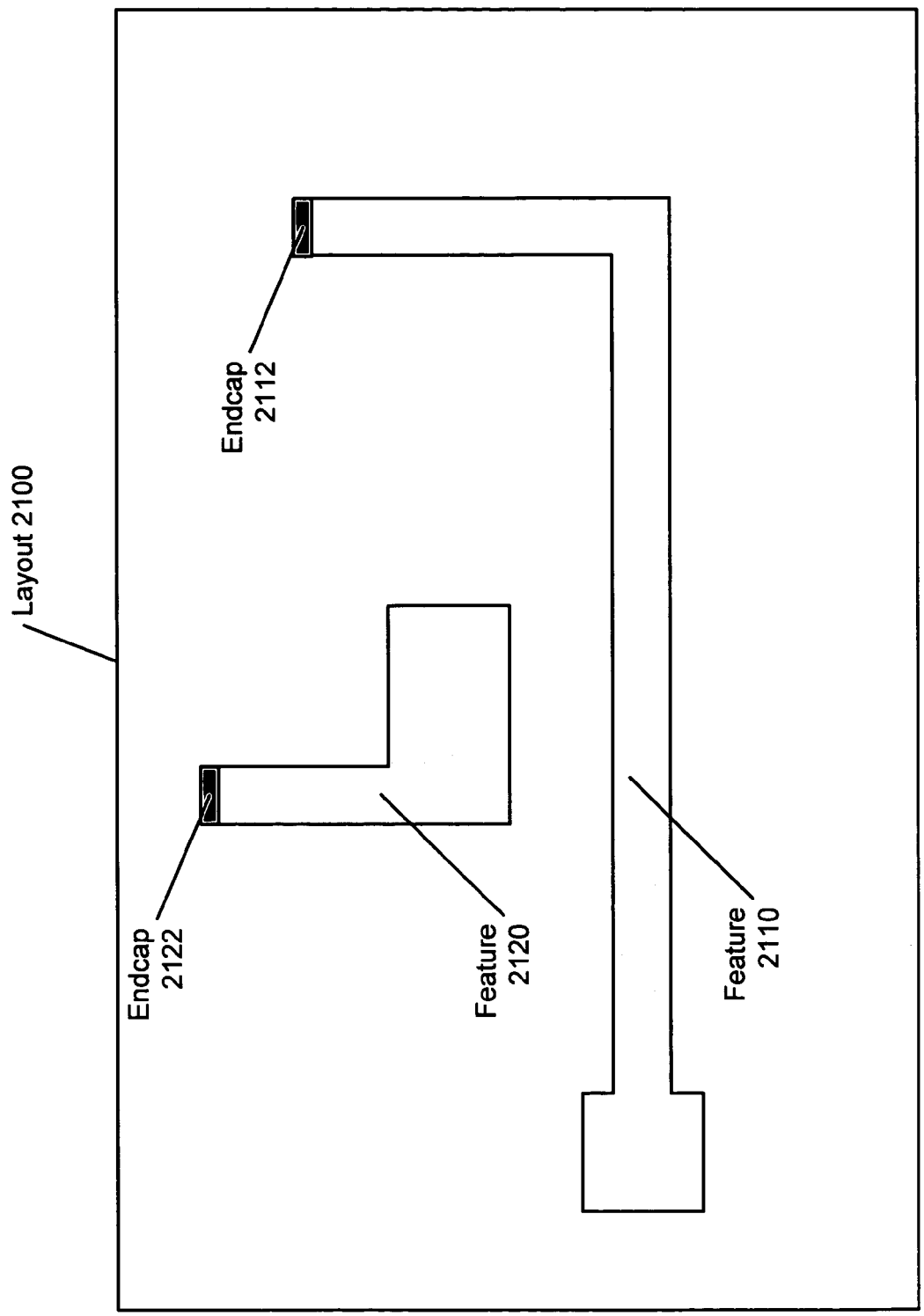
FIG. 21 illustrates an example layout after endcap identification.

Other embodiments of the invention use information from multiple layers in defining and selecting appropriate cost functions. Turning briefly to FIG. 21 which shows a layout 2100, if a small rectangular area (e.g. the ends of the feature 2110 or the end of the feature 2120) was determined to be a contact landing pad, a different cost function could be selected. According to one embodiment of the invention, when contact landing pads are detected, there is a preference as expressed by the formulation of the cost function to use the maximum number of cuts to improve printing of the region. Other examples include avoiding cuts adjacent to the diffusion regions that define transistors, e.g. at a T-junction, etc. (see FIG. 19 where diffusion 1910 forms a gate with feature 1900 and a cutting location 1940 is indicated). Some other rule types might include via layer-metal layer interaction detection to ensure electrical connectivity as well as for local interconnect-polysilicon interactions.

Ultimately, the cost functions may be used by embodiments of the invention during the process of FIG. 25 and more particularly during steps 2540 and 2545, which will be described in greater detail below.

Branch and Bound

A brief discussion of branch and bound algorithms will be provided as some embodiments of the invention make use of the same for solving the phase assignment problem. There are a number of varieties of branch and bound algorithms that are well known. In one embodiment, the branch and bound algorithm in the abraCAD™ software from Cadabra Design Automation, a Numerical Technologies Company, San Jose, Calif., is used.

The phase assignment problem can be set up for branch and bound by viewing the problem as selecting a single path from $2^n$ possible paths in a tree (representing the search space) where n is the number of phase shifters in a given layout, or layout region, being processed for phase assignment. Initial phase assignments can be provided for one or more phase shifters to start the process and provide initial costs. The solver searches the solution space while simultaneously bounding the search space, e.g. by eliminating paths that appear to result in high costs. This allows the continued branching (search) of portions of the solution space that result in lower costs.

The stopping point can be user selected: run until minimum reached, phase assignment cost below a threshold value, for a given period of time and then select lowest cost found at that point, etc. Additionally, advantageously, branch and bound can generally be performed in parallel if sufficient computing resources are available.

Alternatively, graph based algorithms can be used to solve the phase assignment problem as appropriate using weighted graph edges and graph coloring algorithms.

Now, the process of defining the phase layers and complimentary trim layer will be considered in greater detail.

Process Flow

Turning to FIG. 20, a process flow for preparing a layout is shown. The process of FIG. 20 can be used in conjunction with the process of FIG. 25 to design a phase layer and trim layer to substantially define a pattern of a layout using phase shifting. The resultant layouts can be used to define phase shifting masks, and corresponding trim masks, that can in turn be used in lithographic processes to define integrated circuits.

The process starts at step 2000 as the maximum shifter area is determined. This is simply the preferred shifter sizes, e.g. a given distance n nm from the structures to be defined. As described in conjunction with FIG. 4-5, this can be computed after identification of endcaps. For one sample λ=248 nm process, the preferred shifter area is 150-300 nm. The particular value of n can be determined from simulations and/or test mask exposures and will be lithography process, design, and layout dependent.

Turning to FIG. 21, a layout 2100 is shown including two features, a feature 2110 and a feature 2120. FIG. 21 shows the layout after the endcaps, endcap 2112 and endcap 2122, have been identified. Then, in FIG. 22, the layout 2200 is shown that includes the layout 2100 and a boundary 2230 defining the maximum, or preferred, shifter width to use in defining the features as a heavy dashed line.

Next, at step 2005, several intermediate values and/or shapes can be computed for later use. In some embodiments, these values and/or shapes are computed only as needed. The following values and/or shapes are pre-computed according to one embodiment:

non-field=shifter shapes+original layout field=area within the boundary−non-field These values and/or shapes can then be more easily used in subsequent steps. Similarly, the locations of non-critical areas can be identified. For example, all minimum size regions such as wire bends (corner of L), intersections of wires (T), and other non-minimum width features can be identified; all of which can be considered non-critical.

Figure 23:
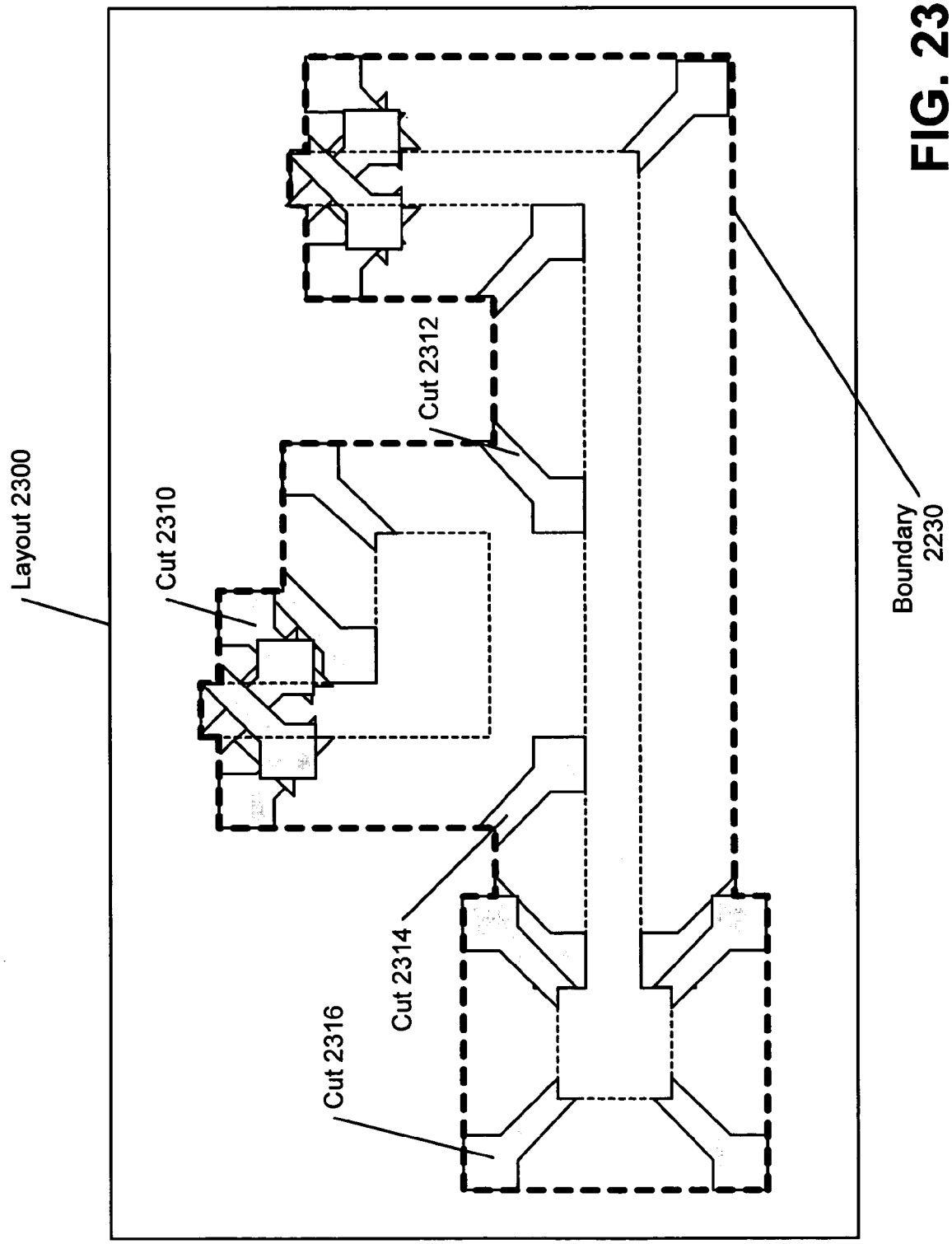
FIG. 23 illustrates the field cuts for the layout of FIG. 22.

Next, at step 2010, the locations of cuts from the field are determined. This is easy understand with respect to FIG. 23 where the layout 2300 is shown including cuts from the boundary 2230 inward towards the field in a predefined cut shape (see FIG. 3) at each corner of the boundary 2230. As can be seen, some of the locations of the cuts would overlap the features, e.g. near endcaps. Other cuts, e.g. the cut 2310, are notable as the cut only exists because of how the line ends are handled and the cut is not generated by step 2015. Other similar examples include the cut 2312 and the cut 2314. In contrast a number of the other cuts, e.g. the cut 2316, occur both at a corner of the boundary and a corner of a feature. Thus, the cut 2316 is also found at step 2015.

Figure 24:
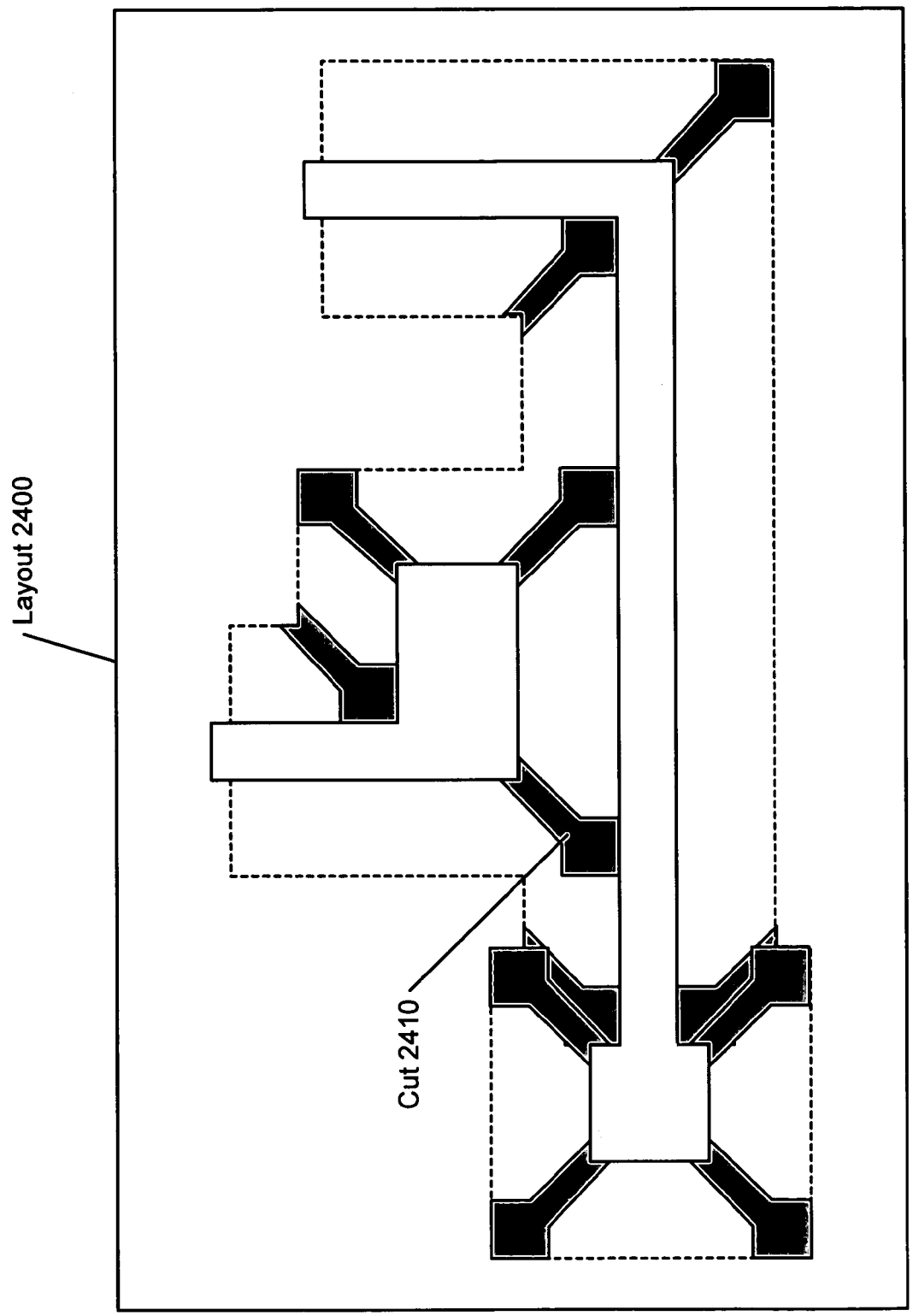
FIG. 24 illustrates the corner cut shapes for the layout FIG. 22.

The process continues at step 2015, with the identification of corner cut shapes, e.g. from the corners features to the boundaries. This is shown in FIG. 24, including the layout 2400. In FIG. 24, the boundary edge has been made thinner to emphasize that the cut locations are determined by the corners of the features. Again, as compared to FIG. 23, several additional cut locations are found, e.g. the cut 2410. Again, as in step 2010, the cut shape is in accordance with the shape seen in FIG. 3. The step 2010 and step 2015 can be done in parallel, out of order with respect to one another, and/or combined into a single step.

Additionally, in some embodiments, possible cuts are computed along non-critical portions of features, e.g. the back of the T in FIG. 19 (not shown). In one embodiment, these cutting locations can be computed in conjunction with the determination of non-critical regions at step 2005 of the process of FIG. 20. If that option is selected, then for each edge, cuts of the minimum width centered about the middle of the non-critical region can be computed for later use as an additional step of FIG. 20 (not shown).

As noted the process of FIG. 20 is preparatory in nature. In some embodiments, the entire process is omitted with values computed during the process of FIG. 25 on an as needed basis. Upon completion of the process of FIG. 20, the process of FIG. 25 is then commenced. From a conceptual point of view, at the start of process FIG. 25, the layout being operated on is the layout shown in FIG. 21 and all of the values computed during the process of FIG. 20 are preserved, e.g. in extra layers of the layout, memory, etc.

Figure 25:
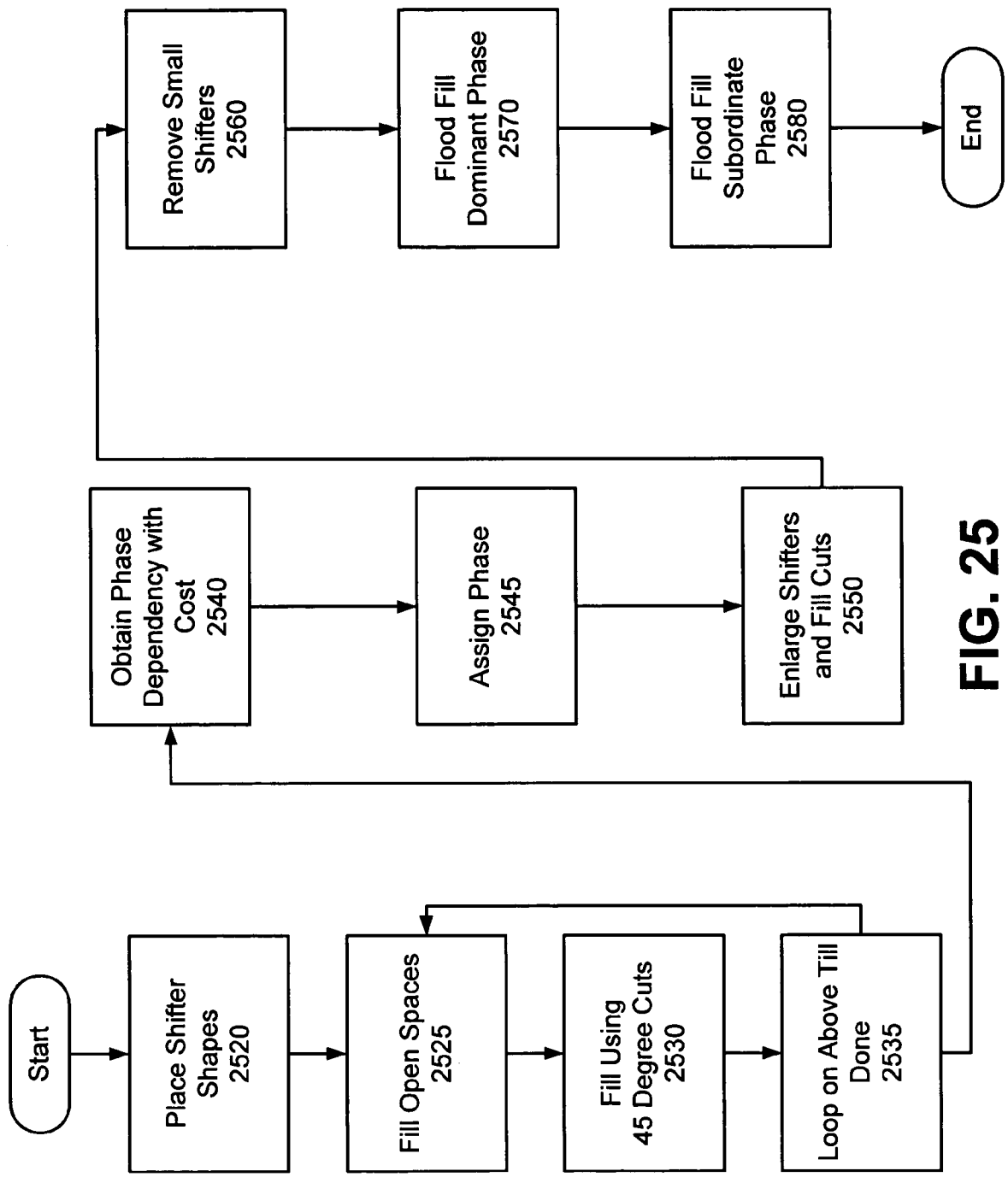
FIG. 25 is a process flow diagram for designing a phase layer and a trim layer to substantially define a pattern of a layout using phase shifting.

The process of FIG. 25 starts at step 2520 with initial placement of shifter shapes. For illustration purposes, several cutting locations are shown as dotted outlines. In one embodiment, the shifters are placed according to the basic shape shown in FIG. 6. The shifter shapes are placed along each edge of the layout, e.g. the layout 2600 in FIG. 26. Turning first to the shifter 2610, it was placed abutting the edge of the adjacent feature. The shifter size is maximized while obeying the distance to edge constraint $d_1$ (see FIG. 6). As can be seen if the shifter, e.g. the shifter 2610, cannot be extended to the preferred width, the extension approach shown in FIGS. 11-13 can be used. Additionally, if there are two cuts in region (e.g. left hand side of shifter 2614) then the shifter will ensure that both remain open (this effect may be implicit in the value of $d_1$ for inner and outer corners.).

Figure 26:
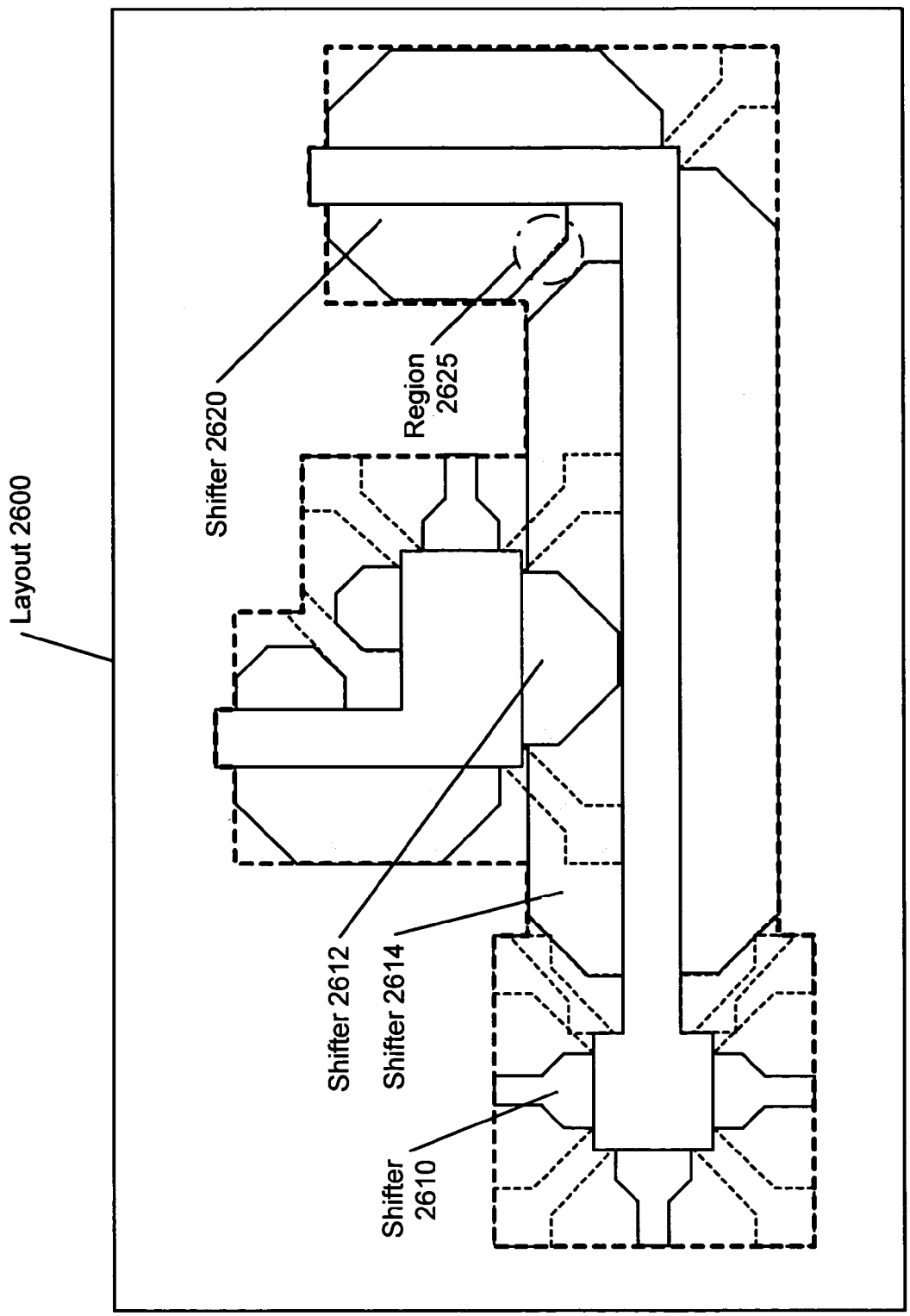
FIG. 26 illustrates the layout of FIG. 21 after placement of shifters according to the process of FIG. 25.

Also, note that FIG. 26 does not show merger of shifters, e.g. the shifter 2612 and the shifter 2614. Which can happen as part of step 2520 and/or step 2525. Additionally, as noted, the shifter shapes are designed to admit a cut. This is shown in FIG. 26 by the shifter 2620, for example. Here, the shifter comes quite close to the adjacent shifter as shown in the region 2625 (shown as a dashed circle), but the angles of the trapezoidal portion of the shifter 2620 admit the cut. Similarly outer corners admit cuts as shown in FIG. 10 from all angles.

Figure 27:
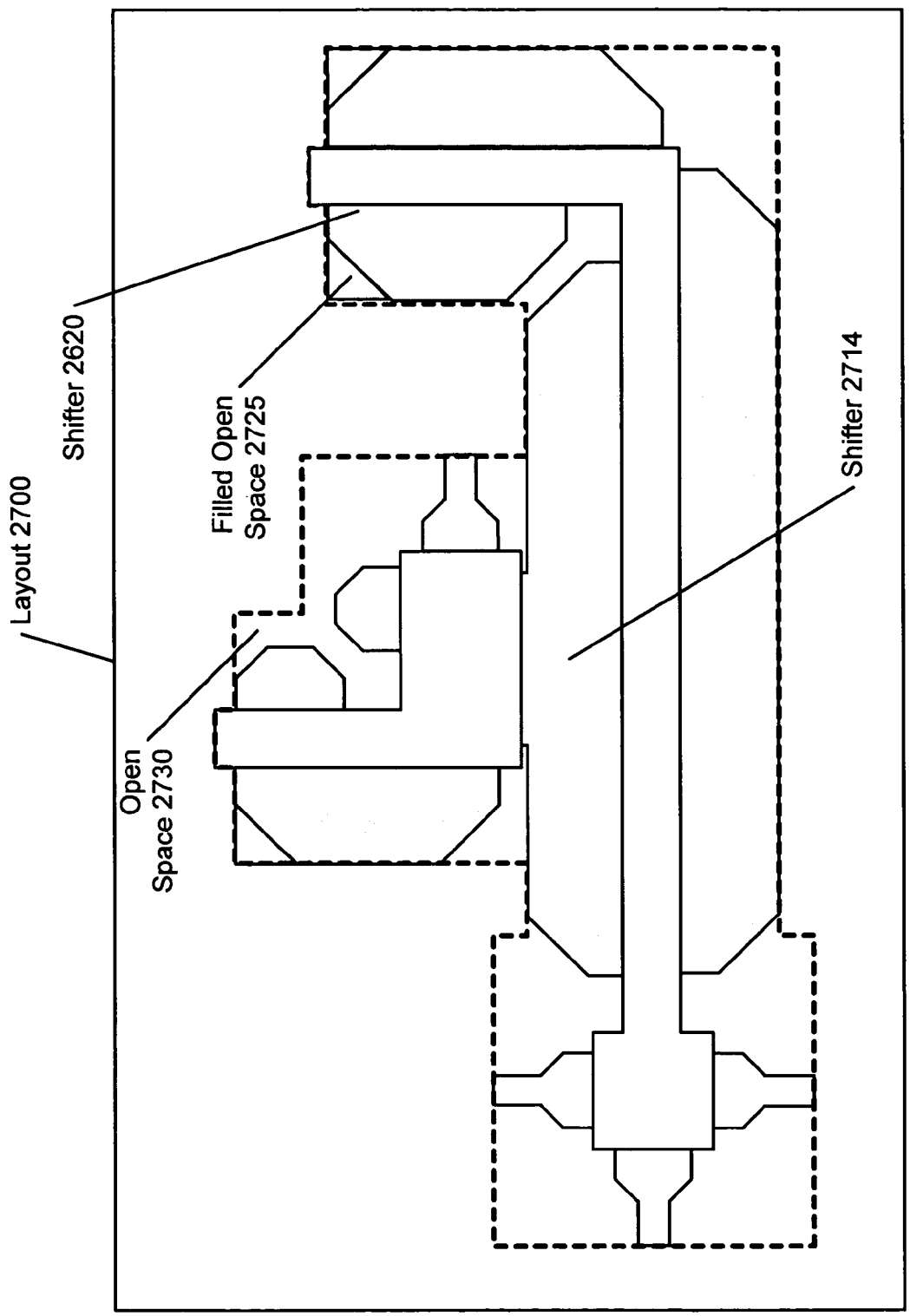
FIG. 27 illustrates the layout of FIG. 26 after some open spaces have been filled according to the process of FIG. 25.

The process then continues at step 2525 with the filling open spaces and shifter mergers. Shifter merging and notch fill was described above with respect to FIGS. 7-9 and that process can occur at this step (or it could have been performed as part of step 2520). For example, the shifter 2612 and the shifter 2614 can be merged and notch filled at this step to form the shifter 2714 shown in the layout 2700 of FIG. 27. Additionally, open spaces such as corners near endcaps can be removed as seen in FIG. 27 where the formerly open space adjacent to the shifter 2620 is now filled (e.g. filled open space 2725). More generally, the process can be best understood if the cuts are removed from view as seen in FIG. 27 and each open space is considered. Take for example the open space 2730. As can be seen the open space touches three distinct phase shifters. This makes that open space an unsuitable candidate for filling at this step. The requirement is that the space touch only one shifter or only one non-critical shape.

Other open spaces adjacent to shifters have been filled in FIG. 27 as well (reference numerals omitted). Additionally, although the filled open spaces are shown as distinct triangular polygons in FIG. 27, the shifter shape can be formed as single or multiple polygons depending on the formats supported by the layout description format (see, e.g., the single polygon used for the shifter 2620 and the filled open space 2725 in FIG. 28).

At step 2530, the process continues with filling making use of forty-five degree cuts. This involves filling shifters, e.g. as seen in FIG. 12. However, it is undesirable to simply fill all corners. In one embodiment, the test to determine whether or not the space is filled is: (i) will the filled area remain design rule compliant, (ii) will the expanded shifter touch two non-critical areas (field or non-critical features). The relevant non-critical features can easily be computed at this step. The non-critical features comprise those portions of the original layout not abutting a shifter and field. The cleanup provided at step 2530 can be seen in layout 2800 of FIG. 28 where a number of the forty-five degree shifters have been filled, e.g. fill 2810, fill 2812, and fill 2814. But, note that region 2820, region 2822, and region 2824 did not get filled. In the case of the region 2822 and the region 2824, a shifter merger would have occurred. In the case of the region 2820, the region abuts two cuts and so it is kept open. More specifically in some embodiments, the shifters are expanded if the area touches one cut, at most one shifter, the field, and at most two corners of the original layout.

Next, at step 2535 the process loops on the above steps (2525-2530) until the process is complete and then continues at step 2540. The stopping criteria can include whether or not changes were made to the shifter shapes during the previous pass through the loop, a fixed number of iterations, other stopping criteria and/or combinations of the above, e.g. loop at most 5 times but stop as soon as no changes are made.

The specific breakdown and components of the steps 2520-2535 can be altered; however, at the time step 2540 has begun the shifter shapes should be established and to the extent practical at a maximal size (width, length, filled open spaces, etc.). That is because steps 2540-2565 primarily assign phase rather than reshape and/or redefine shifters.

The process continues at step 2540 with the determinations of phase dependencies and computations of cost functions. As described above in connections with FIGS. 14-19, cost functions describe the relative badness (or goodness depending on the formulation) of permitting a particular type of phase assignment to different shifters. As noted, the cost functions can be layer sensitive, have different formulations for different distances of interaction, etc. Note, that to provide a useful reduction in processing costs, the layout can be grouped into small regions, or clusters, for processing throughout the process of FIG. 25. The benefits of clustering though are most apparent during step 2545, e.g. if branch and bound is used then the value of n will be smaller for a portion of a layout than for the entire layout. In one embodiment, a cluster comprises a region of layout within a single boundary polygon, thus a single layout might have hundreds, or thousands, of clusters.

Figure 28:
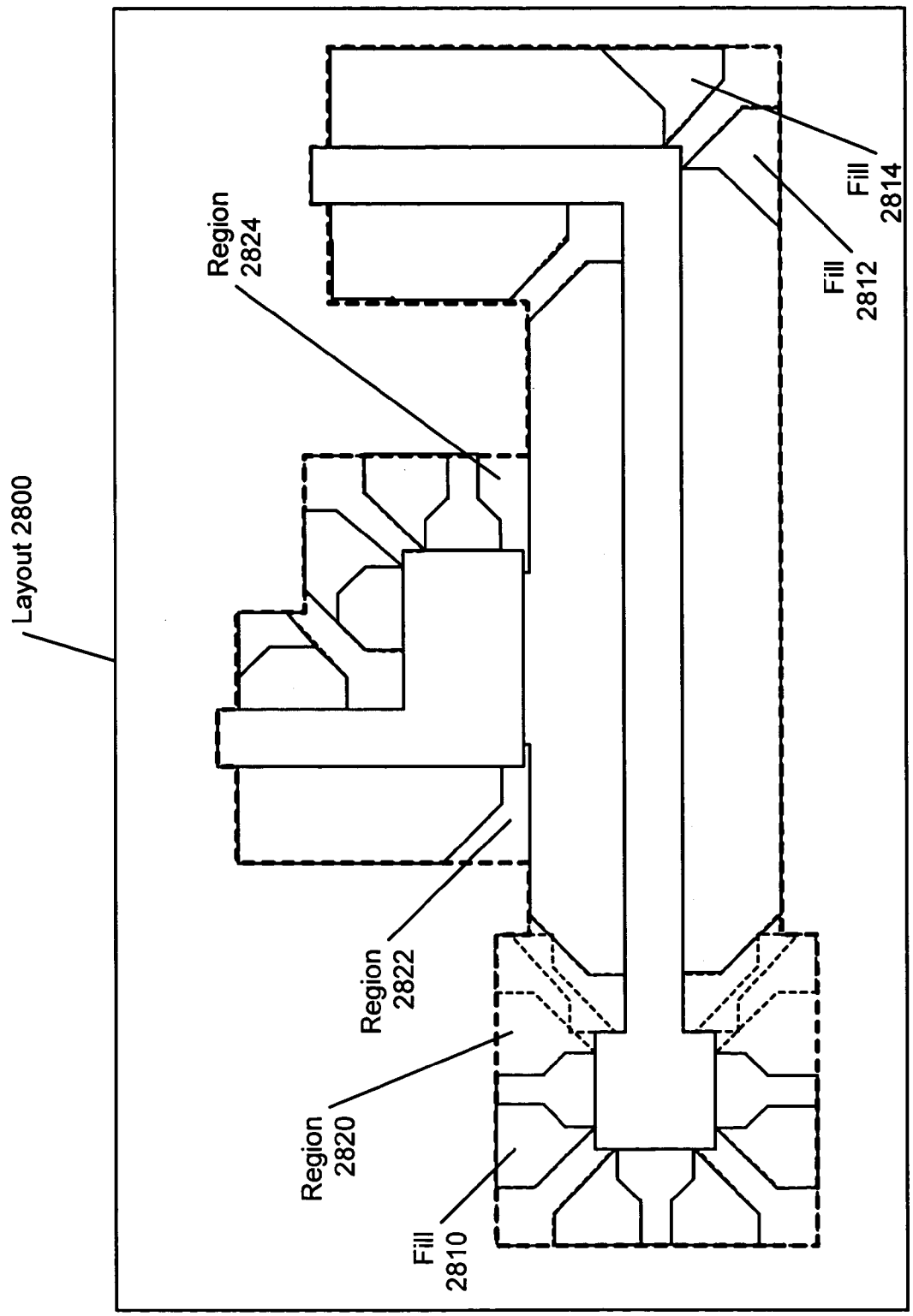
FIG. 28 illustrates the layout of FIG. 27 after additional refinement of the shifter shapes according to the process of FIG. 25.
Figure 29:
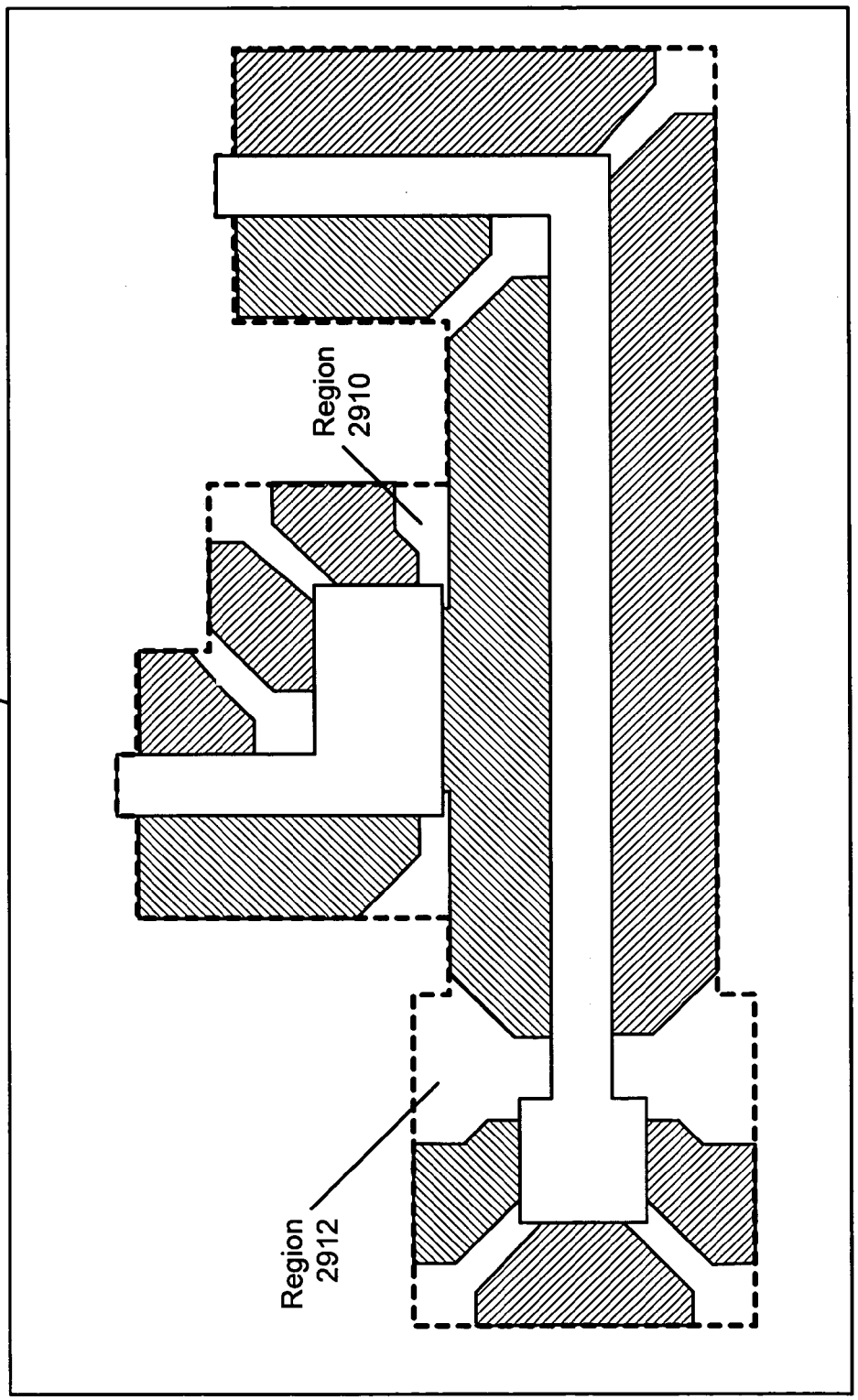
FIG. 29 illustrates the layout of FIG. 28 after initial phase assignment as occurred according to the process of FIG. 25.

At step 2545, phase assignment is performed. According to one embodiment, a branch and bound type algorithm is used, see above. In the process, the specific cuts that will actually be used are determined. For example if two shifters are separated by a cut, but are assigned the same phase, they can eventually be merged. Turning to FIG. 29, the layout of FIG. 28 is shown as the layout 2900 with initial phase assignments.

Next, at step 2550, shifters can be enlarged and cuts filled. In one embodiment, this is performed by growing the original layout towards the boundary and then computing the open spaces. If a given open region touches shifters of all one phase then that region can be filled with that phase. Contrast, for example, the region 2910 (touching two different phased shifters) with the region 2912 (touching two same phased shifters). If appropriate other algorithms can be used to identify the open regions, or spaces, which can be filled according to this step.

Figure 30:
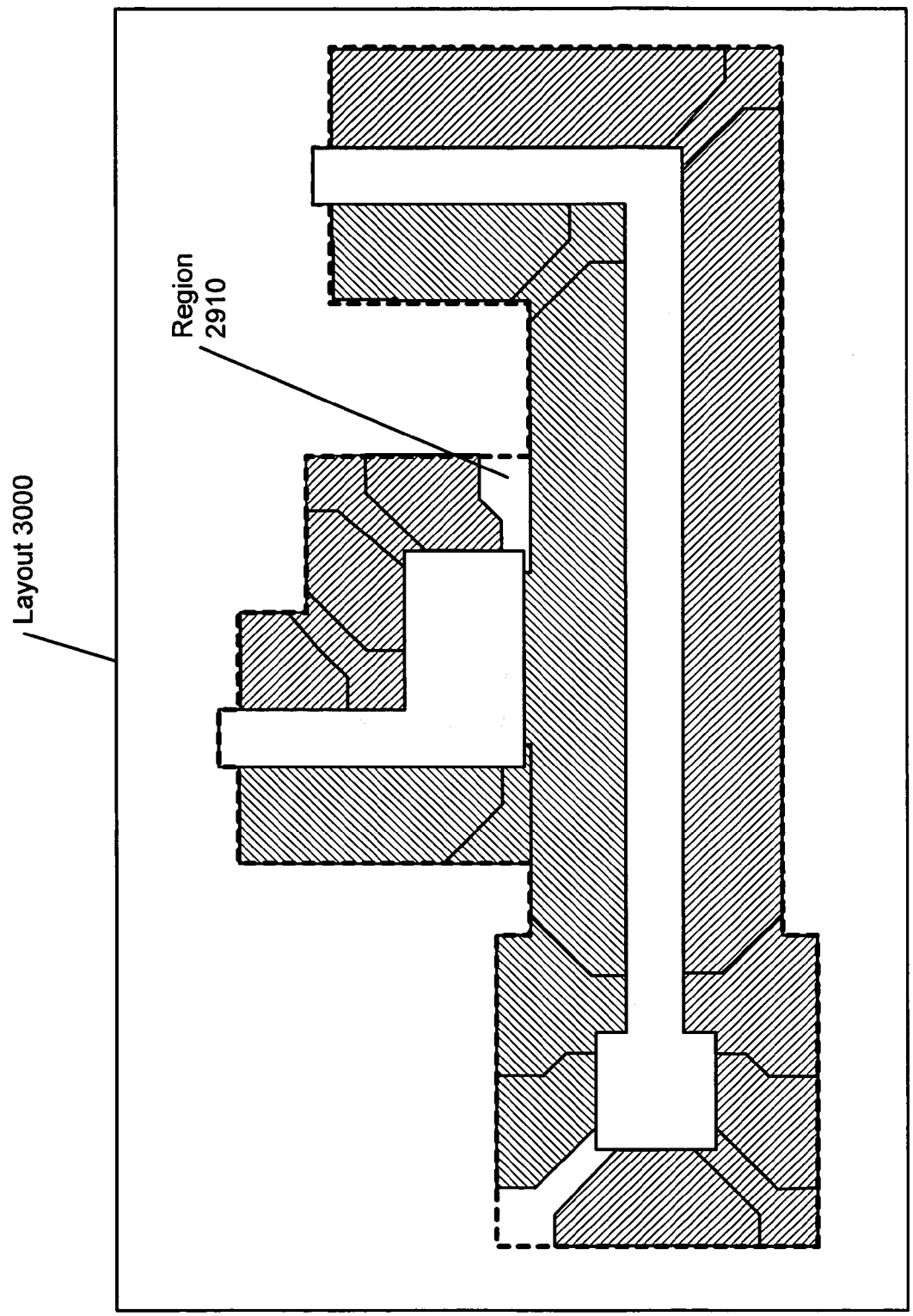
FIG. 30 illustrates a phase layer for the layout of FIG. 29 after enlargement of shifters according to the process of FIG. 25.

The results of step 2550 are shown in FIG. 30 where the layout 3000 shows that the shifters have been enlarged to fill the cut spaces. As noted, the region 2910 is not filled by this step because the phase of the adjacent shifters are different.

The process continues at step 2560 with the removal of small shifters. This can be based on a predetermined sizing criteria. For some layouts this will result in open spaces that can be filled with the dominant, or subordinate, phase when the process continues at steps 2570 and 2580, respectively. The example layout does not have any shifters to be removed at step 2560 and so the layout is not modified by step 2560.

Next, at step 2570, further refinement of the shifters occurs. This includes flood filling cuts with the dominant phase of the adjoining areas. Turning briefly to the layout 3100 of FIG. 31, a shifter 3110 and a shifter 3120 define a feature 3160 similar to the feature 2120 seen in the other layouts; however due to the absence of feature 2110 in the layout 3100 there are shifters all around the large region of the feature 3160 in FIG. 31. The layout 3100 has been processed according to the process of FIG. 20 and the process of FIG. 25. After step 2550, the shifter shapes shown of the shifter 3120 and the shifter 3110 have been established. At step 2560, the flood fill 3130 and will be converted from open space to shifters. The decision to make the phase of shifter 3110 the dominant phase in the cutting region of the cut 3150 can be based upon a number of factors: the total area and phase of surrounding phase shifters, relative edge length of shifters abutting the open space, etc. Here, the phase of the shifter 3110 was determined to be dominant, e.g. from edge length abutting the formerly open space.

Figure 31:
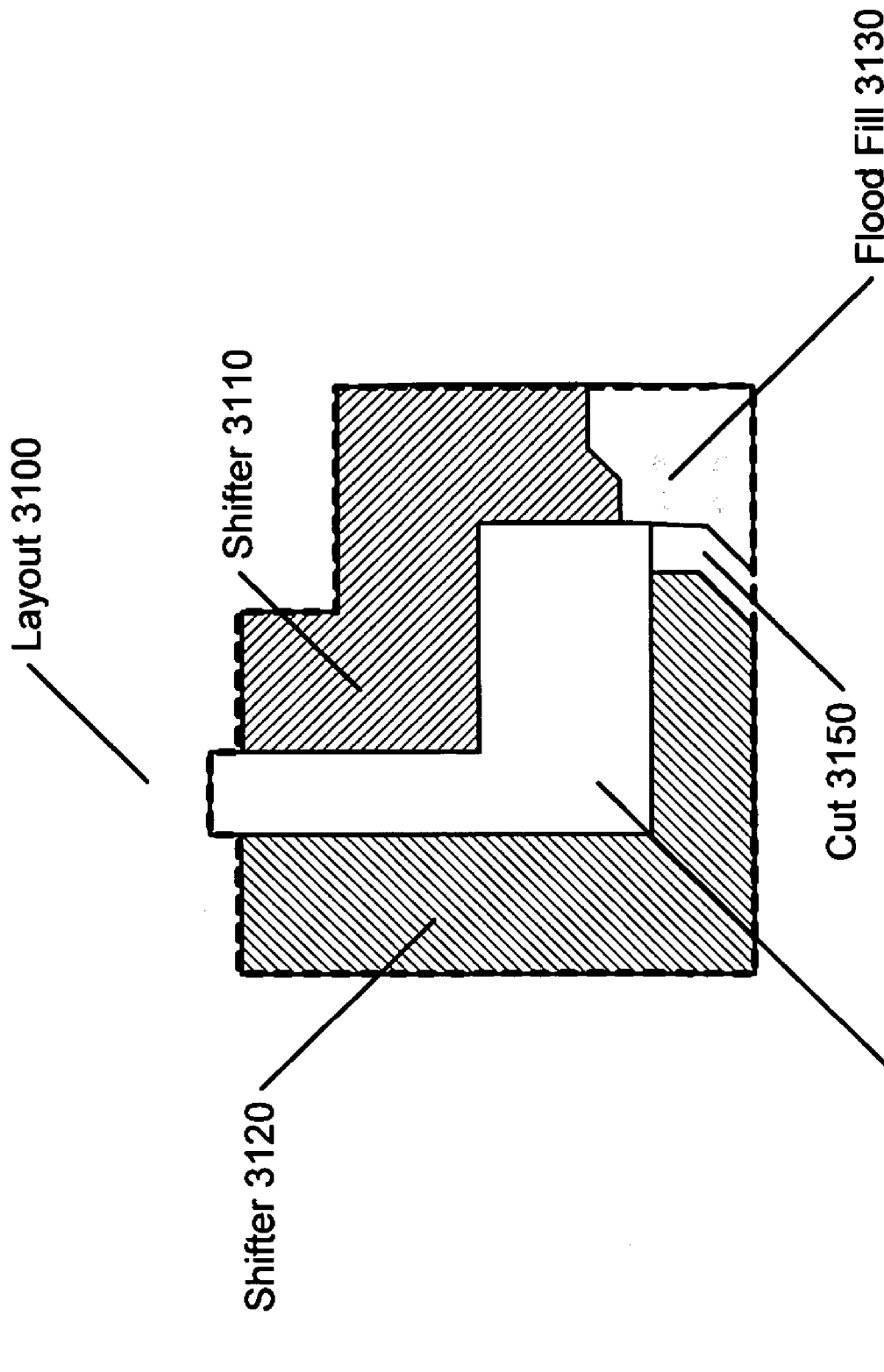
FIG. 31 illustrates the refinement of phase shifters through flood filling using the dominant phase.

As can be seen in FIG. 31, one effect of selecting the dominant phase can be to determine the position of the resulting cut, e.g. the cut 3150. In FIG. 31, the cut 3150 is vertically oriented and abuts the shifter 3120. If however the shifter 3120 had been found to have the dominant phase, then the resulting cut would have been horizontally oriented and adjacent to the shifter 3110.

Figures 32, 33, 34:
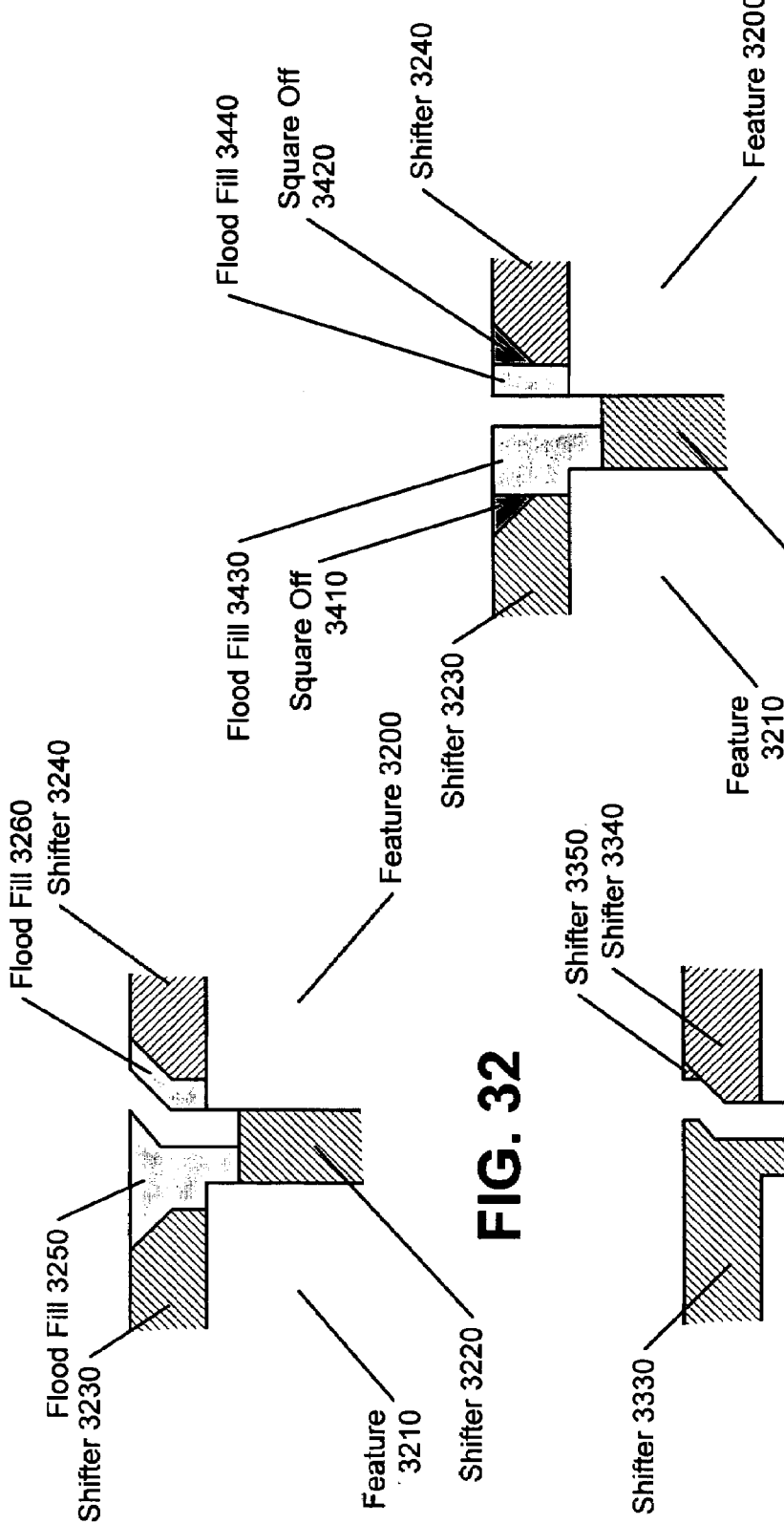
FIG. 32 illustrates the refinement of phase shifters through flood filling using the dominant phase.
FIG. 33 illustrates the refinement of phase shifters through flood filling using the subordinate phase.
FIG. 34 illustrates the refinement of phase shifters through squaring off and flood filling using the dominant phase.

As part of step 2570, any minimum spacing or minimum edge length violations created during the flood fill of step 2570 can be corrected (not shown in FIG. 31). Turning to FIG. 32 a portion of a simple layout processed in a similar fashion to the layout of FIG. 31 is shown. In FIG. 32, a feature 3200 and a feature 3210 have the shifter 3220, the shifter 3230 and the shifter 3240 placed around the features to define the features. At step 2570, the shifter 3250 and the shifter 3260 were added during the flood fill with the dominant phase. This leaves a sharp corner that is not design rule compliant on the shifter 3250 where it abuts the cut. During step 2560, that corner can be removed as shown by the shifter 3330 of FIG. 33. However, this removal in turn makes the opening larger than is absolutely necessary at the top, e.g. larger than the minimum separation between shifters.

During step 2580, the subordinate phase can be used to make the cut opening between the shifter 3330 and the shifter 3340 the minimum allowed separation throughout by filling open spaces using the subordinate phase, thus adding a shifter 3350 as seen in FIG. 33. As in step 2570, spacing and edge length violations can be corrected after the fill.

Looking at FIGS. 31-33 it can be seen that the cut shapes, while design rule compliant, are relatively complex and may present slight difficulties for mask manufacturing, inspection, etc. Accordingly, some embodiments of the invention include a step in the process of FIG. 25 (not shown) to square off shifter shapes. This will result in straighter cuts as seen in FIG. 34 where the layout of FIG. 32 has been squared (square off 3410 and square off 3420) and then step 2470 was applied resulting in flood fill 3430 and flood fill 3440. Note also that step 2580 will not result in any changes to the layout of FIG. 34 as there will be no additional open space to fill. Note also that the resulting cut is easy to manufacture.

More specifically, the square off step can occur any time after phase assignment and in one embodiment occurs between step 2560 and step 2570. In one embodiment the criterion for squaring off a shifter is that the square off section to be added back is neither (i) touching or adjacent within a predetermined separation to a shifter of a different phase nor (ii) overlaps with any other square off sections. Also the square off can include two possible square off for shifters of the type shown in FIG. 12, e.g. shifter 1202. Specifically, one square off could make the trapezoidal region rectangular while leaving the top unchanged. Also, the top portion could then be separately squared with the filled in formerly trapezoidal section. This type of double square off can be seen in FIG. 35 just above the cut 3510 where the squared off portion is shown as a separate shifter shape for illustrative purposes.

Figure 35:
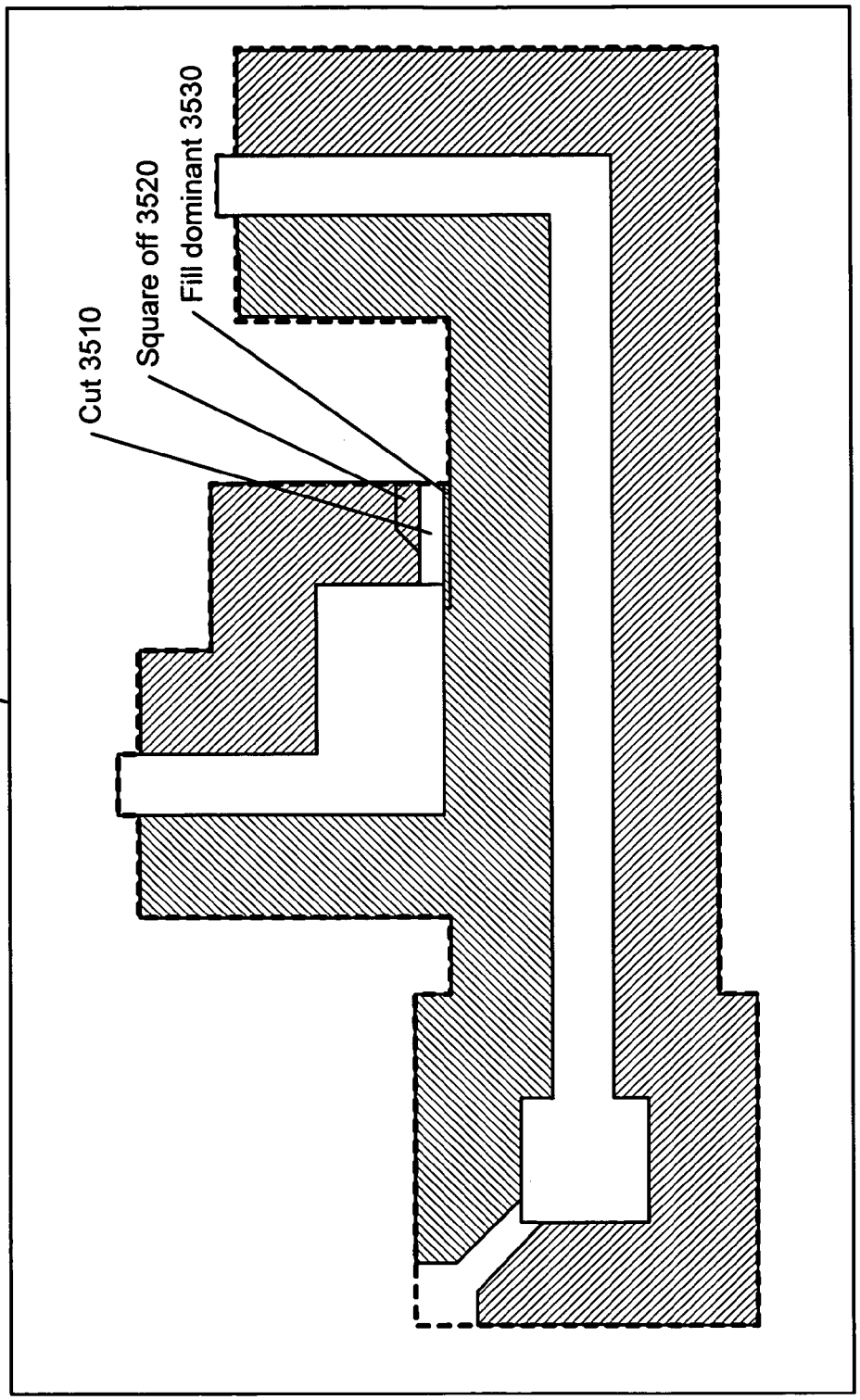
FIG. 35 illustrates the phase layer for the layout of FIG. 30 after refinement of the shifters according the process of FIG. 25.

The results of step 2560 and step 2570 for the layout of FIG. 30 are shown as layout 3500 in FIG. 35 (note that the square off procedure described above was used.). Note the square off of the shifters around the cut 3510, e.g. square off 3520, followed by the fill with the dominant phase, e.g. fill dominant 3530. The process then continues to step 2580 where the flood fill is repeated; however, this time the subordinate, rather than dominant phase is used in deciding which regions to fill. In other respects, step 2580 is identical to step 2570. In the example layout shown, there is no additional filling to occur at step 2580.

At this point, according to some embodiments of the invention, processing of the layout is complete.

Figure 36:
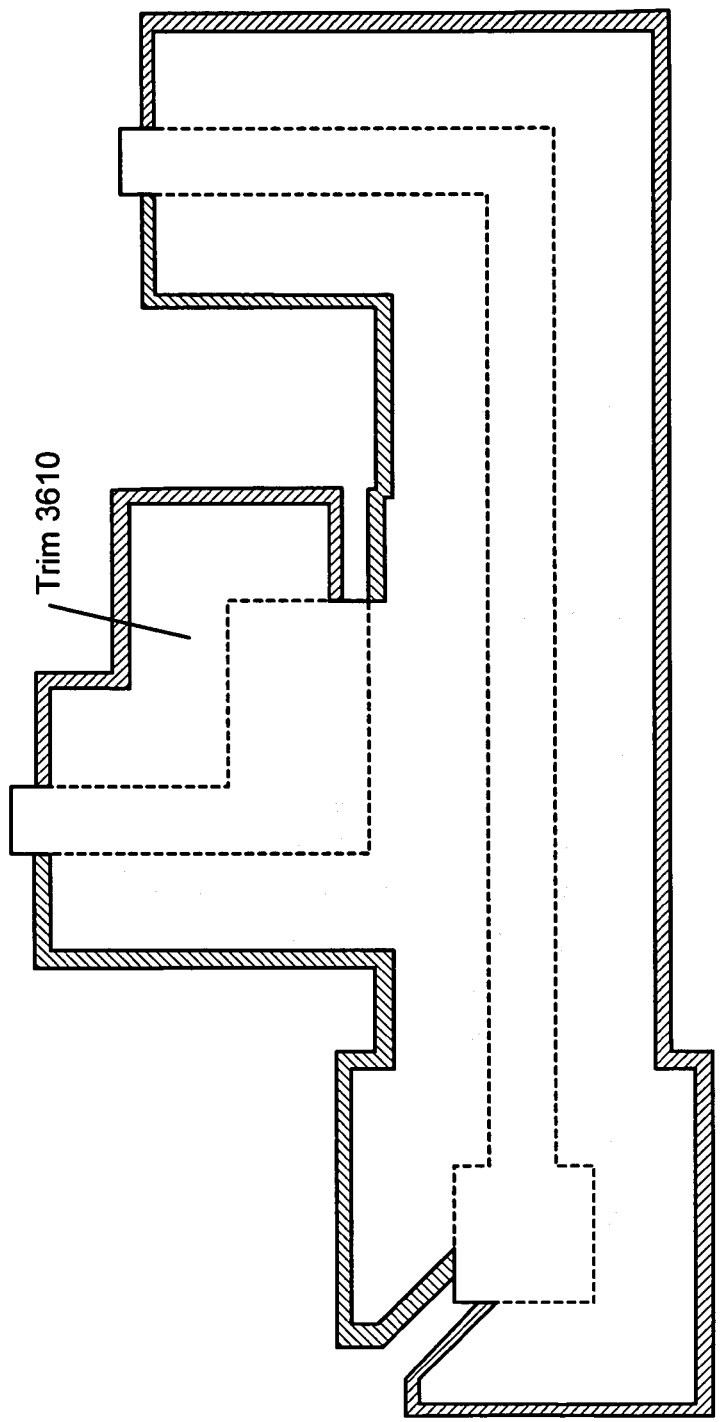
FIG. 36 illustrates the trim layer superimposed on the phase layer of the layout of FIG. 34.

The trim layout, or layer, can be derived from the phase layer. This is shown for the layout of FIG. 35 in FIG. 36 as shown by the trim 3610 in layout 3600 (note the outline of the original features are shown with a dotted outline and the phase layers shown in the background for reference). In one embodiment this can be a simple geometric computation based on the shifter shapes+original layout shrunk by a slight shrink, e.g. 0.02µ, with the original layout then added back in. The amount of the shrink can be determined based on the given process including sufficient tolerances for mask misalignment, exposure conditions, etc. For example, by using different doses for the phase and trim layer, the size of the openings in the trim layer can be smaller than might otherwise be acceptable to clear phase artifacts. See, e.g. U.S. patent application Ser. No. 09/972,428 entitled "Exposure Control For Phase Shifting Photolithographic Masks" having inventors Christophe Pierrat, et. al., filed 5 Oct. 2001.

Figure 37:
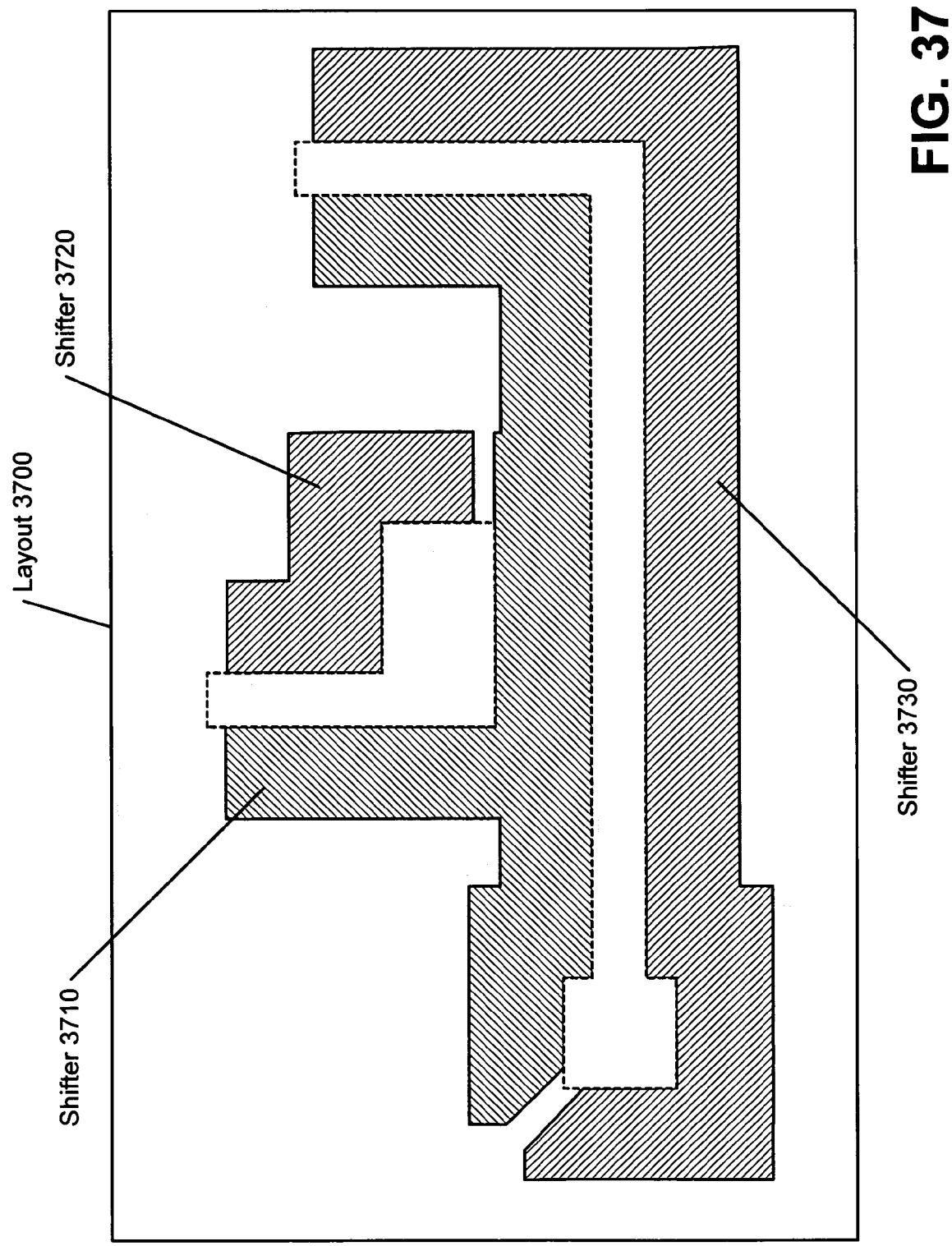
FIG. 37 illustrates the completed phase shifting layout for the layout of FIG. 34.

Turning to FIG. 37 the complete layout 3700 for the phase shifting mask is shown with the phase shifters as light transmissive regions (shifter 3710, shifter 3720, and shifter 3730) and opaque protective material (e.g. chrome) elsewhere on the mask. For illustrative purposes the outlines of the original features are shown as a dotted outline. As noted the shifter 3710 may be in one layer of the GDS-II output file containing the mask description while the shifter 3720 and the shifter 3730 are in another (e.g. 0 in one layer, 180 in the other). Additionally, but not shown, the cuts could be continuous phase and/or multiphase light transmissive regions, e.g. 0-180 gradually, 90 in cuts, 60 and 120 in cuts, and/or some other combinations. FIG. 38 illustrates the complete trim layout 3800 for the complementary trim mask showing the trim 3610. Additionally, as was originally noted in conjunction with FIG. 2, it is possible to use a diagonal rather than notched opening on the outer corner, shown as a dotted line for alternate corner 3810.

Also, some additional post processing may be required and/or desirable to for compliance of the layouts with design and mask manufacturing rules. For example, turning to the layouts of FIG. 37 and FIG. 38, there is an extremely short edge in both the shifter and trim layers adjacent to the region of the cut 3510 (see FIG. 35). This edge may be removed by extending the width of the trim and shifter along the edge perpendicular to that short edge to eliminate the short edge, shown only on trim layer in FIG. 38 as a dashed line for post processed edge 3820.

Representative Alternative Embodiments

Additionally, although the description has primarily focused on examples of defining a polysilicon, or "poly", layer within an IC, phase shifting can be used to define other layers of material, e.g. interconnects, metal, etc.

In some embodiments, different shapes created by intermediate and final processing steps are maintained in different layers of a single data file. For example, if the GDS-II stream format is used, the original layout could be maintained in a first layer, the zero degree shifters in a second layer, the 180-degree shifters in a third layer, and the trim layer in a fourth layer. In other embodiments, multiple data files are used for separating relevant information. Additionally, as seen in the figures, the results of intermediate processing steps can be output and viewed to better understand the shifter shaping and assignment process for a given layout.

In some embodiments, the resultant layout comprises a layout where at least one of:

eighty percent (80%) of non-memory portions in one layer of material in the layout;
eighty percent (80%) of a part of the floorplan in one layer of material;
eighty percent (80%) of cells in a given area;
ninety percent (90%) of a layer of material;
ninety five percent (95%) of a layer of material;
ninety nine percent (99%) of a layer of material;
one hundred percent (100%) of a layer of material;
one hundred percent (100%) of a in a functional unit of the chip (e.g. ALU) in one layer of material;
one hundred percent (100%) of features in a layer of material that are in the critical path of the design;
one hundred percent (100%) of features in a layer of material above or below certain dimensions, e.g. all features with a critical dimension 50 µm<CD<100 µm;
everything in a layer of material except those features that cannot be phase shifted due to phase conflicts that cannot be resolved;
everything in a layer of material except test structures; and
one hundred percent (100%) of all non-dummy features, e.g. features providing structural support for processing purposes, and non-electrically functional features in a layer of material are defined using phase shifting. Further it should be understood that even when a feature is substantially defined using the phase shifting mask (e.g. the feature 3160 in layout 3100 of FIG. 31) portions of the feature at cut openings and end-caps are defined by the complimentary mask. Therefore, features such as the feature 3160 are considered to be defined using the phase shifting (or using the "phase shifting mask").

Embodiments of the invention can include manufactured masks and/or mask sets fabricated according to the layouts defined according to embodiments of the invention. For example, the layouts of FIG. 37 and FIG. 38 could be processed by mask data preparation software such as CATS™ from Transcription Enterprises, Inc., a Numerical Technologies company, San Jose, Calif. to produce mask data files in formats suitable for use by mask writing and fabrication machines. Embodiments of the invention include finished integrated circuits including a layer of material defined by masks constructed from layouts defined according to embodiments of the invention.

Embodiments of the invention include a method of manufacturing a layer of material an integrated circuit. One wafer fabrication process used in such embodiments comprises: applying a photoresist layer to the top surface of a wafer; baking the photoresist layer; positioning the first mask over the photoresist layer; exposing the photoresist layer through the first mask; positions the second mask over the photoresist layer; exposing the photoresist layer through the second mask; baking the wafer; developing the photoresist layer; chemical etching or ion implantation; and removing the photoresist layer. Additional layers of material can be similarly defined. The first and second mask are the phase shifting mask and complimentary mask created from the layouts described above. For example the first mask could be a mask constructed from the layout 3700 of FIG. 37 and the second mask could be a mask constructed from the layout 3800 of FIG. 38. The mask exposure order can be reversed according to one embodiment of the invention, e.g. complimentary mask exposed then phase shifting mask.

Some embodiments of the invention include computer programs for performing the processes of FIG. 17. In one embodiment, the process is implemented using the abraCAD™ software produced by Cadabra Design Automation, a Numerical Technologies company, San Jose, Calif. In one embodiment, the process is described using an AL language program inside the abraCAD™ software. In some embodiments, the computer programs are stored in computer readable media, e.g. CD-ROM, DVD, etc. In other embodiments, the computer programs are embodied in an electromagnetic carrier wave and/or computer data signal.

For example, the electromagnetic carrier wave and/or computer data signal may include the programs being accessed over a network.

As used herein, the terms lithography and/or optical lithography refer to processes that include the use of visible, ultraviolet, deep ultraviolet, extreme ultraviolet, x-ray, e-beam, and/or other radiation sources for lithography purposes.

Conclusion

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

We claim:

1. A photolithographic mask for defining a target pattern in a layer to be formed using the photolithographic mask, the target pattern comprised of a plurality of features, the photolithographic mask comprising:

a dark field mask having phase shifting openings, the phase shifting openings defined by a process comprising placing a plurality of shifter shapes proximate to edges of the plurality of features, wherein the plurality of features includes a first feature having a first edge and a second edge, the first edge adjoining the second edge, and wherein the plurality of shifter shapes includes a first shifter shape placed on the first edge and a second shifter shape placed on the second edge, the first shifter shape and the second shifter shape separated by a minimum distance;

assigning phase to the plurality of shifter shapes according to phase dependencies and costs to create a plurality of phase shifters;

refining the plurality of phase shifters; and producing a computer readable definition of the photolithographic mask.

2. The photolithographic mask of claim 1, wherein the placing further comprises placing the first shifter shape and the second shifter shape such that a cut can be admitted between the first shifter shape and the second shifter shape.

3. The photolithographic mask of claim 2, wherein the cut comprises an opening comprised of a substantially square notch that is intersected at an offset on a forty-five degree (45°) angle by a straight neck that ends in a squared off form.

4. The photolithographic mask of claim 2, wherein the cut comprises a minimum mask manufacturing width opening between two adjacent shifter shapes.

5. The photolithographic mask of claim 1, wherein the target pattern characterized by one or more of the following: at least eighty percent (80%) of the non-memory portions of the layer are defined by the photolithographic mask; at least eighty percent (80%) of a part of the floorplan in the layer is defined by the photolithographic mask; at least ninety percent (90%) of the layer is defined by the photolithographic mask; all of the features in the critical path of the layer are defined by the photolithographic mask; all features in the layer except those features that are not phase shifted due to phase conflicts are defined by the photolithographic mask; everything in the layer except test structures are defined by the photolithographic mask; and everything in the layer except dummy structures are defined by the photolithographic mask.

* * * * *